US012660379B2

(12) United States Patent
Byun et al.

(10) Patent No.: US 12,660,379 B2
(45) Date of Patent: Jun. 16, 2026

(54) ASSEMBLY SUBSTRATE STRUCTURE OF A DISPLAY DEVICE HAVING A SEMICONDUCTOR LIGHT EMITTING DEVICE AND A DISPLAY DEVICE INCLUDING THE SAME

(71) Applicants: LG ELECTRONICS INC., Seoul (KR); LG DISPLAY CO., LTD., Seoul (KR)

(72) Inventors: Yangwoo Byun, Seoul (KR); Jaeyong An, Seoul (KR)

(73) Assignees: LG ELECTRONICS INC., Seoul (KR); LG DISPLAY CO., LTD., Seoul (KR)

( * ) Notice: Subject to any disclaimer, the term of this patent is extended or adjusted under 35 U.S.C. 154(b) by 860 days.

(21) Appl. No.: 18/077,992

(22) Filed: Dec. 8, 2022

(65) Prior Publication Data

US 2023/0187580 A1    Jun. 15, 2023

(51) Int. Cl.
*H10H 20/831*    (2025.01)
*G09F 9/33*    (2006.01)
*H10H 20/01*    (2025.01)
*H10H 20/833*    (2025.01)
*H10H 20/85*    (2025.01)

(52) U.S. Cl.
CPC ............. *H10H 20/831* (2025.01); *G09F 9/33* (2013.01); *H10H 20/032* (2025.01); *H10H 20/833* (2025.01); *H10H 20/8506* (2025.01)

(58) Field of Classification Search
CPC combination set(s) only.
See application file for complete search history.

(56) References Cited

U.S. PATENT DOCUMENTS

| | | | |
|---|---|---|---|
| 9,825,202 B2 | 11/2017 | Schuele et al. | |
| 11,211,366 B2 * | 12/2021 | Park | H10H 20/01 |
| 2017/0133550 A1 * | 5/2017 | Schuele | H10H 20/018 |
| 2022/0351993 A1 * | 11/2022 | Jeong | H01L 21/67144 |

FOREIGN PATENT DOCUMENTS

| | | | | |
|---|---|---|---|---|
| KR | 10-2019-0118992 A | 10/2019 | | |
| KR | 10-2020-0010706 A | 1/2020 | | |
| KR | 10-2020-0014868 A | 2/2020 | | |
| KR | 10-2020-0026775 A | 3/2020 | | |
| KR | 10-2020-0060602 A | 6/2020 | | |
| WO | WO-2020262752 A1 * | 12/2020 | ......... | H01L 25/0753 |

* cited by examiner

*Primary Examiner* — Mark W Tornow
*Assistant Examiner* — Priya M Rampersaud
(74) *Attorney, Agent, or Firm* — Birch, Stewart, Kolasch & Birch, LLP

(57)    ABSTRACT

The embodiment relates to a display device including a semiconductor light emitting device. A display device including the semiconductor light emitting device according to an embodiment can include a substrate, a first assembly electrode disposed on the substrate, a second assembly electrode branched and disposed above the first assembly electrode, an insulating layer disposed between the first assembly electrode and the second assembly electrode, an assembly barrier wall including a predetermined assembly hole and disposed on the second assembly electrode, and a semiconductor light emitting diode disposed in the assembly hole and electrically connected to the second assembly electrode.

10 Claims, 17 Drawing Sheets

ASSEMBLY SUBSTRATE STRUCTURE OF A DISPLAY DEVICE HAVING A SEMICONDUCTOR LIGHT EMITTING DEVICE AND A DISPLAY DEVICE INCLUDING THE SAME

CROSS-REFERENCE TO RELATED APPLICATION

Pursuant to 35 U.S.C. § 119(a), this application claims the benefit of an earlier filing date of and the right of priority to PCT Application No. PCT/KR2021/018623, filed in the Republic of Korea on Dec. 9, 2021, the entire contents of which are hereby expressly incorporated by reference into the present application.

BACKGROUND OF THE DISCLOSURE

1. Field of the Disclosure

The embodiment relates to an assembly substrate structure of a display device having a semiconductor light emitting device and a display device including the assembly substrate.

2. Background of the Related Art

Large-area displays include liquid crystal displays (LCD), OLED displays, and micro-LED displays.

A micro-LED display is a display using a micro-LED, which is a semiconductor light emitting device having a diameter or cross-sectional area of 100 μm or less, as a display device.

Micro-LED display uses micro-LED, which is a semiconductor light emitting device, as a display device. Therefore, Micro-LED display uses micro-LED has excellent performance in many characteristics such as contrast ratio, response speed, color gamut, viewing angle, brightness, resolution, lifespan, luminous efficiency and luminance.

In particular, micro-LED displays have the advantage of being able to separate and combine screens in a modular way, so that size or resolution can be freely adjusted and flexible displays can be implemented.

However, since large-sized micro-LED displays require millions of micro-LEDs, there is a technical problem in that it is difficult to quickly and accurately transfer micro-LEDs to a display panel.

Transfer technologies that have been recently developed include a pick and place process, a laser lift-off method, or a self-assembly method.

Among these, the self-assembly method is a method in which the semiconductor light emitting device finds an assembly position in a fluid and is advantageous for realization of a large-screen display device.

Recently, although a micro-LED structure suitable for self-assembly has been proposed in U.S. Pat. No. 9,825,202, etc., research on a technology for manufacturing a display through self-assembly of micro-LED is still insufficient.

In particular, in the case of rapidly transferring millions of semiconductor light emitting devices to a large display in the prior art, although the transfer speed can be improved, there is a technical problem in that the transfer error rate can be increased, so that the transfer yield is lowered.

In the related art, a self-assembly method using dielectrophoresis (DEP) has been attempted, but the self-assembly rate is low due to the non-uniformity of the DEP force.

Meanwhile, according to the undisclosed internal technology, self-assembly requires a DEP force, but due to the difficulty of uniform control of the DEP force, there is a problem in that the semiconductor light emitting device is tilted to a different location in the assembly hole during assembly using self-assembly.

In addition, in the subsequent electrical contact process due to the tilt phenomenon of the semiconductor light emitting device, there is a problem in that the electrical contact characteristics are reduced and the lighting rate is lowered.

Therefore, according to the unpublished internal technology, even though DEP force is required for self-assembly, when the DEP force is used, there is a technical contradiction in that an electrical contact characteristic is reduced due to the tilting phenomenon.

In addition, the assembly substrate in the unpublished internal technology is a structure having a single assembly electrode of a straight structure. But, since a light emitting device having a circular cross section is assembled, the light emitting device is positioned so as to span the left or right side of the assembly hole, so that it is difficult to assemble it properly in the assembly hole.

In addition, according to unpublished internal technology, the distribution of DEP force is strongly formed not only inside the assembly hole but also on the upper side of the assembly hole during self-assembly using the DEP force. Accordingly, there is a problem in that a screening effect occurs in which a semiconductor light emitting device to be assembled does not enter the assembly hole because a semiconductor light emitting device not to be assembled blocks an entrance to the assembly hole.

SUMMARY OF THE DISCLOSURE

One of the technical problems of the embodiment is to solve the problem of low self-assembly rate due to non-uniformity of DEP force in the self-assembly method using dielectrophoresis (DEP).

In addition, one of the technical problems of the embodiment is that as the distribution of DEP Force is strongly formed not only inside the assembly hole but also on the upper side of the assembly hole, to solve the problem of a screening effect, in which a semiconductor light emitting device to be assembled cannot enter an assembly hole because a semiconductor light emitting device that is not an assembly target blocks the entrance to the assembly hole.

In addition, one of the technical problems of the embodiment is to solve the problem of the screening effect in that the semiconductor light emitting device to be assembled does not enter the assembly hole because the semiconductor light emitting device which is not an assembly target blocks the assembly hole entrance as the distribution of the DEP force is strongly formed not only inside the assembly hole but also on the upper side of the assembly hole.

The technical problems of the embodiment are not limited to those described in this item, and include those that can be understood throughout the specification.

A display device including a semiconductor light emitting device according to an embodiment can include a substrate, a first assembly electrode disposed on the substrate, a second assembly electrode branched above the first assembly electrode, an insulating layer disposed between the first assembly electrode, the second assembly electrode, an assembly barrier wall including a predetermined assembly hole and disposed on the second assembly electrode, and a semiconductor light emitting device disposed in the assembly hole and electrically connected to the second assembly electrode.

The second assembly electrode can include a second body electrode part, and a second-first branch electrode part, a second-second branch electrode part that extend from the second body electrode part in the direction of the first assembly electrode and are spaced apart from each other.

The first assembly electrode can be disposed between the spaced apart second-first branch electrode part and the second-second branch electrode part.

The first assembly electrode and the second assembly electrode cannot be overlapped vertically.

The first assembly electrode can include a first body electrode part and a first extended electrode part extending from the first body electrode part in a direction toward the second assembly electrode part.

The first extended electrode part can be positioned between the second-first branch electrode part and the second-second branch electrode part.

The first extended electrode part can include a first expanded electrode part having a shape corresponding to a horizontal cross-section of the semiconductor light emitting device.

The first extended electrode part can include a first-second extended electrode part extending from the first expanded electrode part in a direction of the second body electrode part.

The second-first branch electrode part or the second-second branch electrode part can include a curved recess inside thereof, the first expanded electrode part can have a shape corresponding to the curved recess.

The second-first branch electrode part or the second-second branch electrode part can include the second branch body part, a second branch protrusion extending from the second branch body in the direction of the first extended electrode part, and a second recess part corresponding to the shape of the first expanded electrode part of the second branch protrusion part.

A V+/V− signal can be applied to the first assembly electrode, and the second assembly electrode can be grounded.

In addition, the display device of the semiconductor light emitting device according to the embodiment can include a substrate, a first assembly electrode disposed on the substrate, a second assembly electrode disposed above the first assembly electrode, an insulating layer disposed between the first assembly electrode and the second assembly electrode, a second insulating layer disposed on the insulating layer and the second assembly electrode, an assembly barrier wall disposed on the second insulating layer having a predetermined assembly hole, and a semiconductor light emitting device disposed in the assembly hole.

In addition, the embodiment can further include a connection electrode connecting an upper surface of the second assembly electrode exposed by removing a portion of the second insulating layer and one side of the semiconductor light emitting device.

The second assembly electrode can include a second body electrode part and a second-first branch electrode part and a second-second branch electrode part extending from the second body electrode part in the direction of the first assembly electrode and spaced apart from each other.

The first assembly electrode can be disposed between the spaced apart second-first branch electrode part and the second-second branch electrode part.

The first assembly electrode can include a first body electrode part and a first extended electrode part extending from the first body electrode part in the direction of the second assembly electrode part.

The first extended electrode part can include a first expanded electrode part having a shape corresponding to a horizontal cross-section of the semiconductor light emitting device.

The second-first branch electrode part or the second-second branch electrode part can include a curved recess inside thereof, and the first expanded electrode part can include a shape corresponding to the curved recess.

In addition, the display device of the semiconductor light emitting device according to the embodiment can include a substrate, a second assembly electrode arranged branching disposed on the substrate, a first assembly electrode disposed between the second assembly electrode and disposed at the same height as the second assembly electrode, an insulating layer disposed between the first assembly electrode and the second assembly electrode, an assembly barrier wall including a predetermined assembly hole disposed on second assembly electrode, the insulating layer, and the semiconductor light emitting device disposed in the assembly hole.

The second assembly electrode can include a second body electrode part and a second-first branch electrode part and a second-second branch electrode part extending from the second body electrode part in the direction of the first assembly electrode and spaced apart from each other.

The first assembly electrode can be disposed between the spaced apart second-first branch electrode part and the second-second branch electrode part.

The first assembly electrode can include a first body electrode part and a first extended electrode part extending from the first body electrode part in the direction of the second assembly electrode part.

The first extended electrode part can include a first expanded electrode part having a shape corresponding to a horizontal cross-section of the semiconductor light emitting device.

The second-first branch electrode part or the second-second branch electrode part can include a curved recess inside thereof.

The first expanded electrode part can include a shape corresponding to the curved recess.

A V+/V− signal can be applied to the first assembly electrode, and the second assembly electrode can be grounded.

EFFECTS OF THE DISCLOSURE

According to the assembly substrate structure of the semiconductor light emitting device display device of the embodiment and the display device including the same, in the self-assembly method using dielectrophoresis (DEP), there is a technical effect that can solve the problem of low self-assembly rate due to non-uniformity of DEP force.

For example, in the embodiment of the assembly electrode, as the first assembly electrode is disposed between the branched second assembly electrodes, a uniform Dep force can be distributed in the assembly hole center, so that the assembly rate can be improved.

For example, according to an embodiment, the inside of the branched second assembly electrode has a curved recess, and the first assembly electrode has a protrusion of curvature corresponding to the curved recess, so that there is special technical effect that a strong DEP force can be uniformly concentrated around the inner periphery of the assembly hole.

That is, according to the embodiment, the effective electrode area of both ends of the first and second assembly electrodes can be increased in the circular dual electrode structure than in the straight assembly electrode structure by controlling the structural shapes of the second assembly electrode and the first assembly electrode. So, the electrostatic capacity of the assembly electrode can be improved and the DEP force can be larger so that the assembly force can be increased, thereby having a technical effect that the strong DEP force can be uniformly concentrated around the inner periphery of the assembly hole.

In addition, according to the embodiment, the central region of the first assembly electrode disposed in the assembly hole center can be formed of a metal having a shape corresponding to the horizontal cross-sectional shape (eg, circular, oval, or polygonal) of the LED chip. Through this, even if there is no or weak DEP force on the LED chip and an inclined LED chip enters the assembly hole, the LED chip can slide from the center to the outside to form a DEP force around the LED chip, and there is a special technical effect that the LED chip can be properly assembled without tilt in the center of the assembly hole.

According to the embodiment, since the second assembly electrode is left-right symmetric about the first assembly electrode, the DEP force is uniform left and right. In addition, since the shape of the first assembly electrode can be manufactured in a circular, elliptical or polygonal shape according to the center of the assembly hole, there is a technical effect that the DEP force can be uniformly applied to the outer edge of the LED chip.

In addition, according to the embodiment, as the V+/V− signal is applied to the first assembly electrode 210, which is the lower electrode, and the second assembly electrode, which is the upper electrode, is grounded, there is a special technical effect that can prevent voltage drop and maintain high assembly force.

Also, according to the embodiment, the distribution of DEP Force can be strongly and uniformly distributed at the inner center of the assembly hole through electric field shielding on the upper side of the assembly hole, and the distribution strength can be controlled weakly on the upper side of the assembly hole. Through this, there is a special technical effect that can prevent a non-assembly semiconductor light emitting device from being located on the upper side of the assembly hole to block the entrance to the assembly hole and can solve the problem of screening effect in which a semiconductor light emitting device to be assembled cannot enter the assembly hole.

In addition, according to the embodiment, there is a technical effect capable of realizing an ultra-high resolution by three-dimensionally disposing the first assembly electrode and the second assembly electrode between the upper and lower side.

The technical effects of the embodiments are not limited to those described in this item, and include those understood the description of the invention.

DETAILED DESCRIPTION OF THE DISCLOSURE

Hereinafter, embodiments disclosed in the present description will be described in detail with reference to the accompanying drawings. The suffixes 'module' and 'part' for components used in the following description are given or mixed in consideration of ease of specification, and do not have a meaning or role distinct from each other by themselves. In addition, the accompanying drawings are provided for easy understanding of the embodiments disclosed in the present specification, and the technical ideas disclosed in the present specification are not limited by the accompanying drawings. Also, when an element, such as a layer, region, or substrate, is referred to as being 'on' another component, this can include that it is directly on the other element or there can be other intermediate elements in between.

The display device described in this specification can include a digital TV, a mobile phone, a smart phone, a laptop computer, a digital broadcasting terminal, a personal digital assistant (PDA), a portable multimedia player (PMP), a navigation, a Slate PC, a Tablet PC, an Ultra-Book, a desktop computer, and the like. However, the configuration according to the embodiment described in this specification can be applied to a display capable device even if it is a new product form to be developed later.

Hereinafter, a light emitting device according to an embodiment and a display device including the light emitting device will be described.

Hereinafter, an assembly substrate structure of a display device having a semiconductor light emitting device according to an embodiment and a display device including the assembly substrate will be described.

Figure 1:
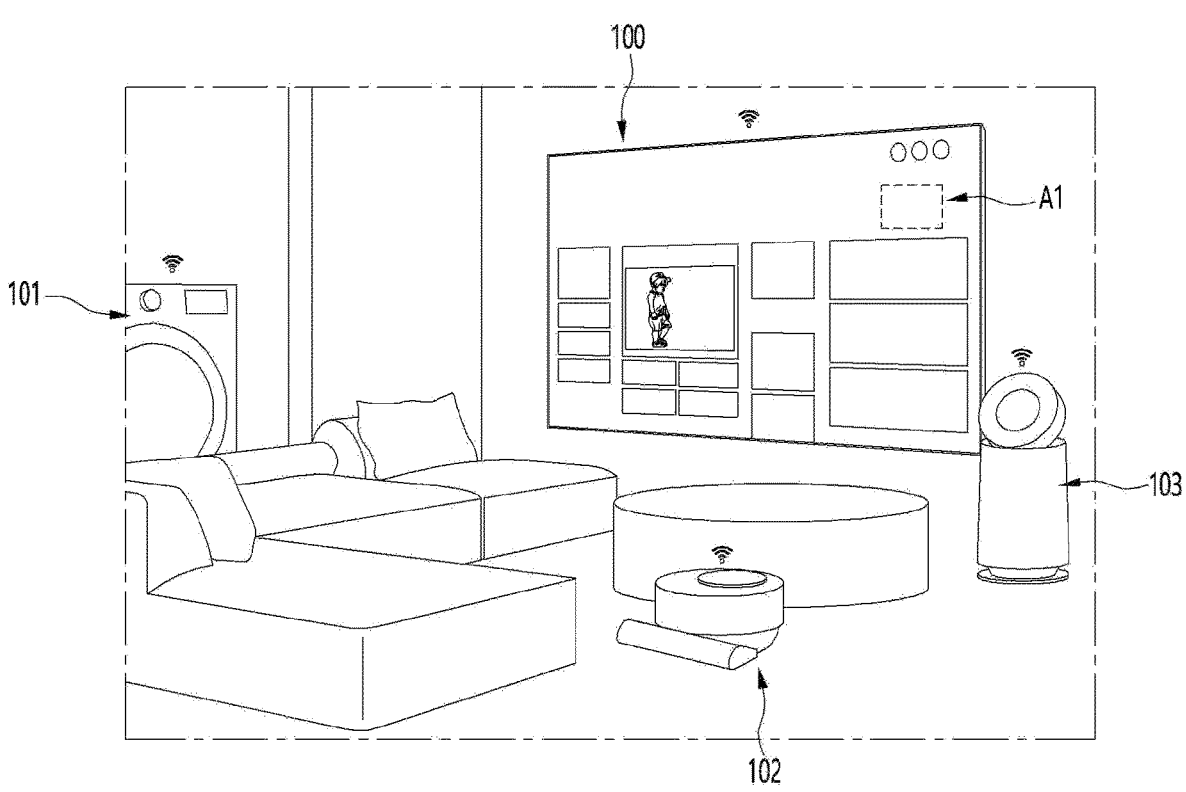
FIG. 1 is an exemplary view of a living room of a house in which a display device according to an embodiment is disposed.

FIG. 1 shows a living room of a house in which the display device 100 according to the embodiment is disposed.

The display device 100 of the embodiment can display the status of various electronic products such as the washing machine 101, the robot cleaner 102, and the air purifier 103, and communicate with each electronic product based on IOT, and can control each electronic product based on the user's setting data.

The display device 100 according to the embodiment can include a flexible display manufactured on a thin and flexible substrate. The flexible display can be bent or rolled like paper while maintaining the characteristics of the conventional flat panel display.

In the flexible display, visual information can be implemented by independently controlling light emission of unit pixels arranged in a matrix form. A unit pixel means a minimum unit for realizing one color. The unit pixel of the flexible display can be implemented by a light emitting device. In an embodiment, the light emitting device can be a Micro-LED or a Nano-LED, but is not limited thereto.

Figure 2:
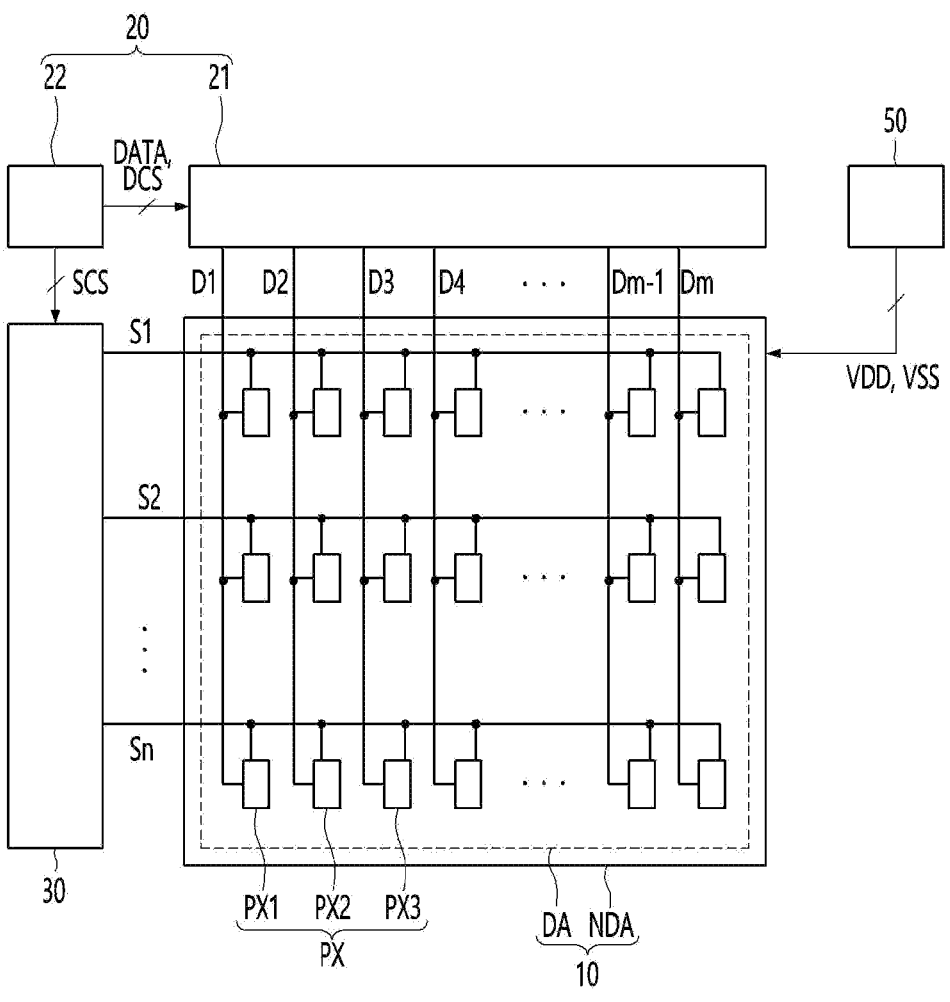
FIG. 2 is a block diagram schematically showing a display device according to an embodiment.
Figure 3:
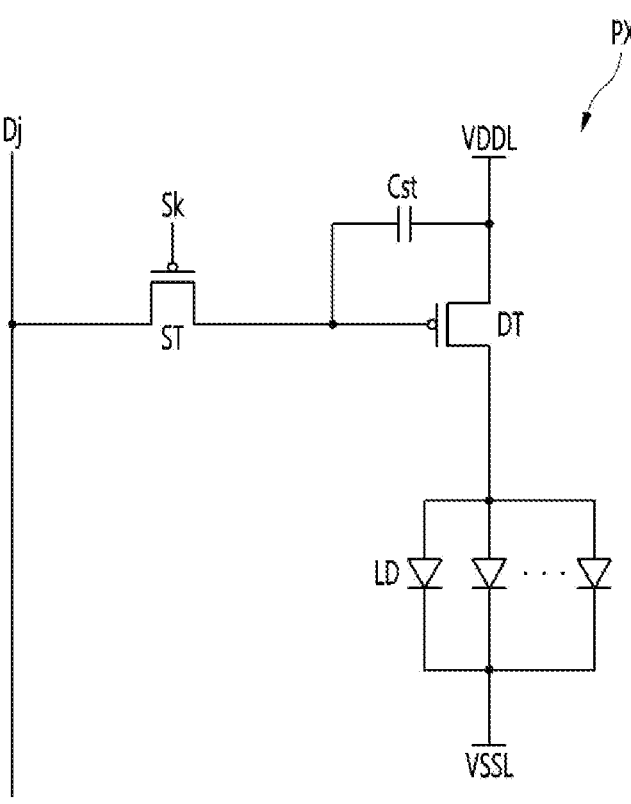
FIG. 3 is a circuit diagram illustrating an example of the pixel of FIG. 2

Next, FIG. 2 is a block diagram schematically showing a display device according to an embodiment, and FIG. 3 is a circuit diagram showing an example of the pixel of FIG. 2.

Referring to FIGS. 2 and 3, the display device according to the embodiment can include a display panel 10, a driving circuit 20, a scan driving unit 30, and a power supply circuit 50.

The display device 100 according to the embodiment can drive the light emitting device using an active matrix (AM) method or a passive matrix (PM, passive matrix) method.

The driving circuit 20 can include a data driving unit 21 and a timing control unit 22.

The display panel 10 can be divided into a display area DA and a non-display area NDA disposed around the display area DA. The display area DA is an area in which pixels PX are formed to display an image. The display panel 10 can include data lines (D1 to Dm, m is an integer greater than or equal to 2), scan lines crossing the data lines D1 to Dm (S1 to Sn, n is an integer greater than or equal to 2), the high-potential voltage line supplied with the high-voltage, the low-potential voltage line supplied with the low-potential voltage, and the pixels PX connected to the data lines D1 to Dm and the scan lines S1 to Sn can be included.

Each of the pixels PX can include a first sub-pixel PX1, a second sub-pixel PX2, and a third sub-pixel PX3. The first sub-pixel PX1 emits a first color light of a first wavelength, the second sub-pixel PX2 emits a second color light of a second wavelength, and the third sub-pixel PX3 emits a third color light of a wavelength can be emitted. The first color light can be red light, the second color light can be green light, and the third color light can be blue light, but is not limited thereto. Also, although it is illustrated that each of the pixels PX can include three sub-pixels in FIG. 2, the present invention is not limited thereto. That is, each of the pixels PX can include four or more sub-pixels.

Each of the first sub-pixel PX1, the second sub-pixel PX2, and the third sub-pixel PX3 can connected to at least one of the data lines D1 to Dm, and at least one of the scan lines S1 to Sn, and a high potential voltage line. As shown in FIG. 3, the first sub-pixel PX1 can include the light emitting devices LD, plurality of transistors for supplying current to the light emitting devices LD, and at least one capacitor Cst.

Although not shown in the drawing, each of the first sub-pixel PX1, the second sub-pixel PX2, and the third sub-pixel PX3 can include only one light emitting device LD and at least one capacitor Cst.

Each of the light emitting devices LD can be a semiconductor light emitting diode including a first electrode, a plurality of conductivity type semiconductor layers, and a second electrode. Here, the first electrode can be an anode electrode and the second electrode can be a cathode electrode, but the present invention is not limited thereto.

Referring to FIG. 3, the plurality of transistors can include a driving transistor DT for supplying current to the light emitting devices LD, and a scan transistor ST for supplying a data voltage to the gate electrode of the driving transistor DT. The driving transistor DT can include a gate electrode connected to the source electrode of the scan transistor ST, a source electrode connected to a high potential voltage line to which a high potential voltage is applied, and a drain electrode connected to first electrodes of the light emitting devices LD. The scan transistor ST can include a gate electrode connected to the scan line Sk, where k is an integer satisfying $1 \leq k \leq n$, a source electrode connected to the gate electrode of the driving transistor DT, and a drain electrode connected to data lines Dj, where j is integer satisfying $1 \leq j \leq m$.

The capacitor Cst is formed between the gate electrode and the source electrode of the driving transistor DT. The storage capacitor Cst can charge a difference between the gate voltage and the source voltage of the driving transistor DT.

The driving transistor DT and the scan transistor ST can be formed of a thin film transistor. In addition, although the driving transistor DT and the scan transistor ST have been mainly described in FIG. 3 as being formed of a P-type MOSFET (Metal Oxide Semiconductor Field Effect transistor), the present invention is not limited thereto. The driving transistor DT and the scan transistor ST can be formed of an N-type MOSFET. In this case, the positions of the source electrode and the drain electrode of each of the driving transistor DT and the scan transistor ST can be changed.

Also, in FIG. 3 has been illustrated each of the first sub-pixel PX1, the second sub-pixel PX2, and the third sub-pixel PX3 can include one driving transistor DT, one scan transistor ST, and 2T1C (2 Transistor-1 capacitor) having a capacitor Cst, but the present invention is not limited thereto. Each of the first sub-pixel PX1, the second sub-pixel PX2, and the third sub-pixel PX3 can include a plurality of scan transistors ST and a plurality of capacitors Cst.

Referring back to FIG. 2, the driving circuit 20 outputs signals and voltages for driving the display panel 10. To this end, the driving circuit 20 can include a data driver 21 and a timing controller 22.

The data driver 21 receives digital video data DATA and a source control signal DCS from the timing controller 22. The data driver 21 converts the digital video data DATA into analog data voltages according to the source control signal DCS and supplies them to the data lines D1 to Dm of the display panel 10.

The timing controller 22 receives digital video data DATA and timing signals from the host system. The timing signals can include a vertical sync signal, a horizontal sync signal, a data enable signal, and a dot clock. The host system can be an application processor of a smartphone or tablet PC, a monitor, or a system-on-chip of a TV.

The scan driver 30 receives the scan control signal SCS from the timing controller 22. The scan driver 30 generates scan signals according to the scan control signal SCS and supplies them to the scan lines S1 to Sn of the display panel 10. The scan driver 30 can include a plurality of transistors and can be formed in the non-display area NDA of the display panel 10. Also, the scan driver 30 can be formed of an integrated circuit, and in this case, can be mounted on a gate flexible film attached to the other side of the display panel 10.

The power supply circuit 50 generates a high potential voltage VDD and a low potential voltage VSS for driving the light emitting devices LD of the display panel 10 from the main power source, and the power supply circuit can supply VDD and VSS to the high-potential voltage line and the low-potential voltage line of the display panel 10. Also, the power supply circuit 50 can generate and supply driving voltages for driving the driving circuit 20 and the scan driving unit 30 from the main power.

Figure 4:
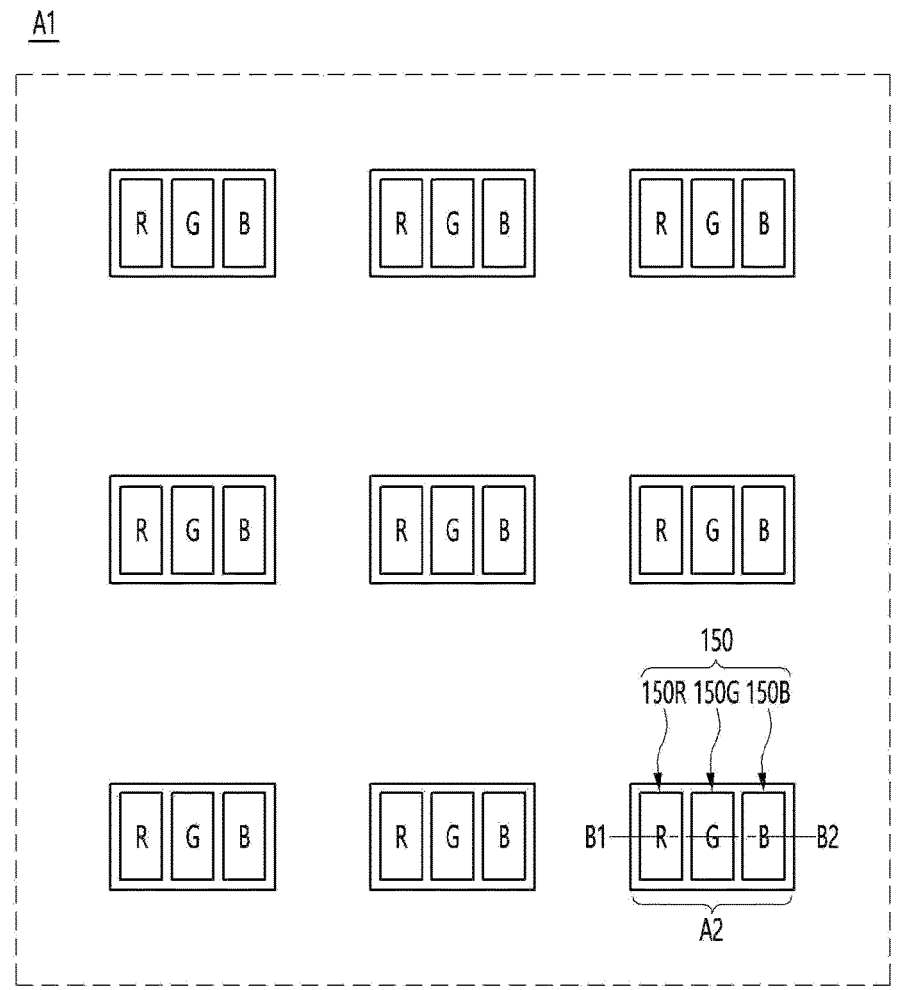
FIG. 4 is an enlarged view of a first panel area in the display device of FIG. 1

Next, FIG. 4 is an enlarged view of the first panel area A1 in the display device of FIG. 1.

Referring to FIG. 4, the display device 100 according to the embodiment can be manufactured by mechanically and electrically connecting a plurality of panel regions such as the first panel region A1 by tiling.

The first panel area A1 can include a plurality of light emitting devices 150 arranged for each unit pixel (PX in FIG. 2).

For example, the unit pixel PX can include a first sub-pixel PX1, a second sub-pixel PX2, and a third sub-pixel PX3. For example, a plurality of red light-emitting devices 150R are disposed in the first sub-pixel PX1, a plurality of green light-emitting devices 150G are disposed in the second sub-pixel PX2, and a plurality of blue light-emitting devices 150B are disposed in the third sub-pixel PX3. The unit pixel PX can further include a fourth sub-pixel in which a light emitting device is not disposed, but is not limited thereto. Meanwhile, the light emitting device 150 can be the semiconductor light emitting device.

Figure 5:
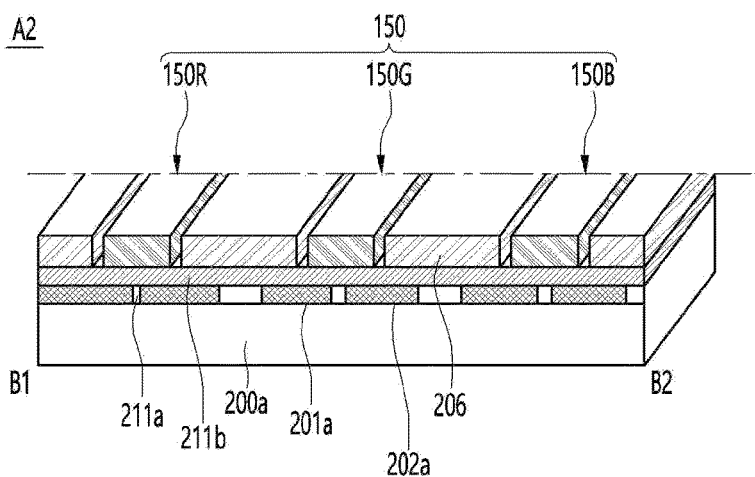
FIG. 5 is a cross-sectional view taken along line B1-B2 of area A2 of FIG. 4

Next, FIG. 5 is a cross-sectional view taken along line B1-B2 of area A2 in FIG. 4.

Referring to FIG. 5, the display device 100 of the embodiment can include a substrate 200a, wirings 201a and 202a spaced apart from each other, a first insulating layer 211a, a second insulating layer 211b, a third insulating layer 206 and a plurality of light emitting devices 150.

The wiring can include a first wiring 201a and a second wiring 202a spaced apart from each other. The first wiring 201a and the second wiring 202a can function as panel wiring for applying power to the light emitting device 150 in the panel, and in the case of self-assembly of the light emitting device 150, also, the first wiring 201a and the second wiring 202a can function as an assembly electrode for generating a dielectrophoresis force.

The wirings 201a and 202a can be formed of a transparent electrode (ITO) or include a metal material having excellent electrical conductivity. For example, the wirings 201a and 202a can be formed at least one of titanium (Ti), chromium (Cr), nickel (Ni), aluminum (Al), platinum (Pt), gold (Au), tungsten (W), molybdenum (Mo) or an alloy thereof.

A first insulating layer 211a can be disposed between the first wiring 201a and the second wiring 202a, and a second insulating layer 211b can be disposed on the first wiring 201a and the second wiring 202a. The first insulating layer 211a and the second insulating layer 211b can be an oxide film, a nitride film, or the like, but are not limited thereto.

The light emitting device 150 can include a red light emitting device 150R, a green light emitting device 150G, and a blue light emitting device 150B0 to form a sub-pixel, respectively, but is not limited thereto. The light emitting device 150 can include a red phosphor and a green phosphor to implement red and green, respectively The substrate 200a can be formed of glass or polyimide. Also, the substrate 200a can include a flexible material such as polyethylene naphthalate (PEN) or polyethylene terephthalate (PET). In addition, the substrate 200 can be made of a transparent material, but is not limited thereto. The substrate 200a can function as a support substrate in the panel, and can function as a substrate for assembly when self-assembling the light emitting device.

The third insulating layer 206 can include an insulating and flexible material such as polyimide, PEN, or PET, and can be integrally formed with the substrate 200a to form one substrate.

The third insulating layer 206 can be a conductive adhesive layer having adhesiveness and conductivity, and the conductive adhesive layer can be flexible to enable a flexible function of the display device. For example, the third insulating layer 206 can be an anisotropy conductive film (ACF) or a conductive adhesive layer such as an anisotropic conductive medium or a solution containing conductive particles. The conductive adhesive layer can be a layer that is electrically conductive in a direction perpendicular to the thickness but electrically insulating in a direction horizontal to the thickness.

The distance between the first and second wirings 201a and 202a is formed to be smaller than the width of the light emitting device 150 and the width of the assembly hole 203H, so that the assembly position of the light emitting device 150 using an electric field can be more precisely fixed.

A third insulating layer 206 is formed on the first and second wirings 201a and 202a to protect the first and second wirings 201a and 202a from the fluid 1200, and the third insulating layer 206 is can prevent leakage of current flowing through the two wirings 201a and 202a. The third insulating layer 206 can be formed of a single layer or multiple layers of an inorganic insulator such as silica or alumina or an organic insulator.

In addition, the third insulating layer 206 can include an insulating and flexible material such as polyimide, PEN, PET, etc., and can be formed integrally with the substrate 200 to form a single substrate.

The third insulating layer 206 has a barrier wall, and an assembly hole 203H can be formed by the barrier wall. For example, the third insulating layer 206 can include an assembly hole 203H through which the light emitting device 150 is inserted (refer to FIG. 6). Accordingly, during self-assembly, the light emitting device 150 can be easily inserted into the assembly hole 203H of the third insulating layer 206. The assembly hole 203H can be referred to as an insertion hole, a fixing hole, or an alignment hole.

The assembly hole 203H can have a shape and a size corresponding to the shape of the light emitting device 150 to be assembled at a corresponding position. Accordingly, it is possible to prevent other light emitting devices from being assembled in the assembly hole 203H or from assembling a plurality of light emitting devices.

Figure 6:
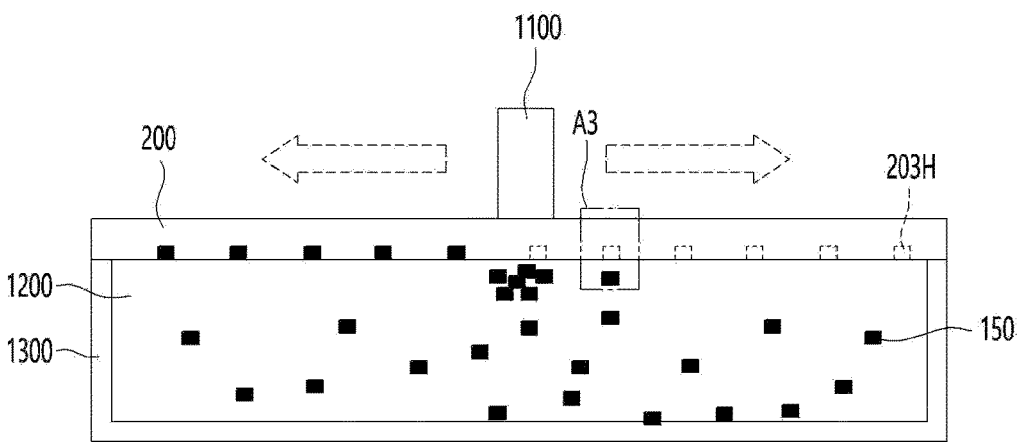
FIG. 6 is an exemplary view in which the light emitting device according to the embodiment is assembled on a substrate by a self-assembly method.
Figure 7:
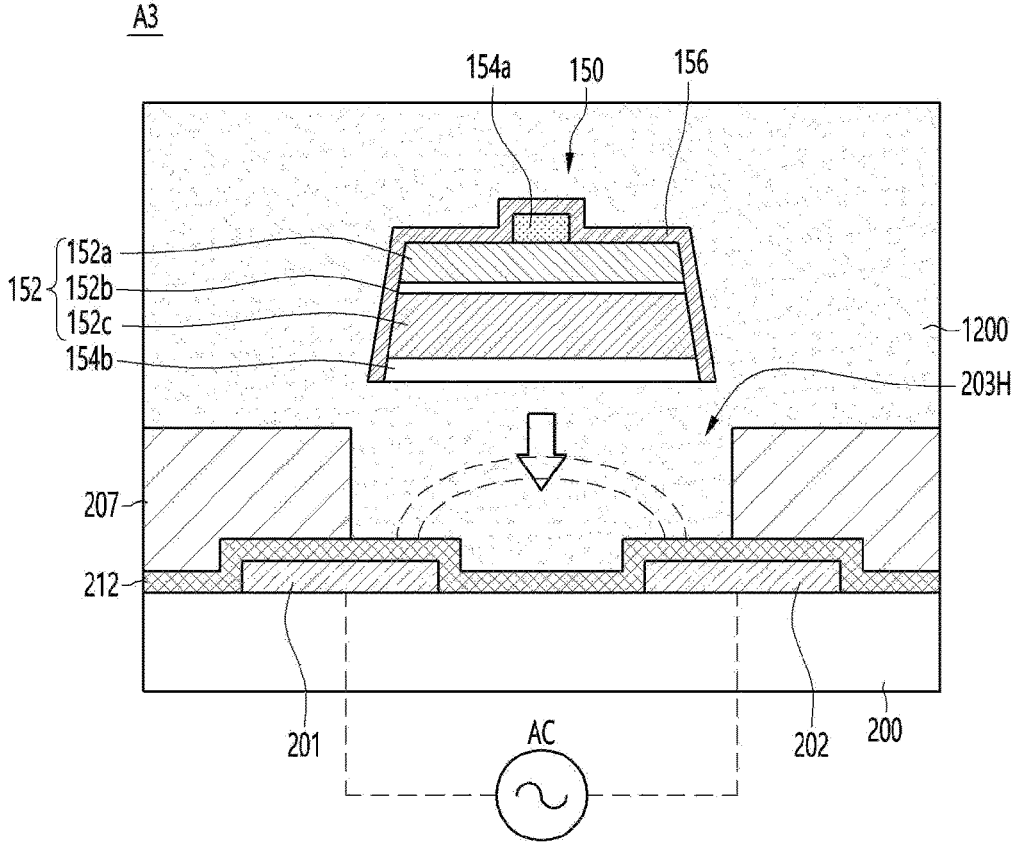
FIG. 7 is a partially enlarged view of area A3 of FIG. 6

Next, FIG. 6 is a view showing an example in which the light emitting device according to the embodiment is assembled on a substrate by a self-assembly method, and FIG. 7 is a partially enlarged view of area A3 of FIG. 6. And FIG. 7 is a diagram illustrating a state in which area A3 is rotated 180 degrees for convenience of explanation.

An example in which the semiconductor light emitting device according to the embodiment is assembled in a display panel by a self-assembly method using an electromagnetic field will be described with reference to FIGS. 6 and 7.

The assembly substrate 200 to be described later can also function as the panel substrate 200a in the display device after assembly of the light emitting device, but the embodiment is not limited thereto.

Referring to FIG. 6, the semiconductor light emitting device 150 can be put into the chamber 1300 filled with the fluid 1200, and the semiconductor light emitting device 150 by the magnetic field generated from the assembly device 1100 can move to the assembly substrate 200. In this case, the light emitting device 150 adjacent to the assembly hole 203H of the assembly substrate 200 can be assembled in the assembly hole 230 by a dielectrophoretic force by an electric field of the assembly electrodes. The fluid 1200 can be water such as ultrapure water, but is not limited thereto. A chamber can be referred to as a water bath, container, vessel, or the like.

After the semiconductor light emitting device 150 is put into the chamber 1300, the assembly substrate 200 can be disposed on the chamber 1300. According to an embodiment, the assembly substrate 200 can be introduced into the chamber 1300.

Referring to FIG. 7, the semiconductor light emitting device 150 can be implemented as a vertical semiconductor light emitting device as shown, but is not limited thereto, and a horizontal light emitting device can be employed.

The semiconductor light emitting device 150 can include a magnetic layer (not shown) having a magnetic material. The magnetic layer can include a magnetic metal such as nickel (Ni). Since the semiconductor light emitting device 150 injected into the fluid can include a magnetic layer, it can move to the assembly substrate 200 by the magnetic field generated from the assembly device 1100. The magnetic layer can be disposed above or below or on both sides of the light emitting device.

The semiconductor light emitting device 150 can include a passivation layer 156 surrounding the top and side surfaces. The passivation layer 156 can be formed by using an inorganic insulator such as silica or alumina through PECVD, LPCVD, sputtering deposition, or the like. In addition, the passivation layer 156 can be formed through a method of spin coating an organic material such as a photoresist or a polymer material.

The semiconductor light emitting device 150 can include a first conductivity type semiconductor layer 152a, a second conductivity type semiconductor layer 152c, and an active layer 152b disposed between the first conductivity type semiconductor layer 152a and the second conductivity type semiconductor layer 152c. The first conductivity type semiconductor layer 152a can be an n-type semiconductor layer, and the second conductivity type semiconductor layer 152c can be a p-type semiconductor layer, but is not limited thereto.

A first electrode layer 154a can be disposed on the first conductivity type semiconductor layer 152a, and a second electrode layer 154b can be disposed on the second conductivity type semiconductor layer 152c. To this end, a partial region of the first conductivity type semiconductor layer 152a or the second conductivity type semiconductor layer 152c can be exposed to the outside. Accordingly, after the semiconductor light emitting device 150 is assembled on the assembly substrate 200, a portion of the passivation layer 156 can be etched in the manufacturing process of the display device.

The assembly substrate 200 can include a pair of first assembly electrodes 201 and second assembly electrodes 202 corresponding to each of the semiconductor light emitting devices 150 to be assembled. The first assembly electrode 201 and the second assembly electrode 202 can be formed by stacking a single metal, a metal alloy, or a metal oxide in multiple layers. For example, the first assembly electrode 201 and the second assembly electrode 202 can be formed including at least one of Cu, Ag, Ni, Cr, ti, Al, Rh, Pd, Ir, Ru, Mg, Zn, Pt, Au, or Hf, but is not limited thereto.

In addition, the first assembly electrode 201 and the second assembly electrode 202 can be formed including at least one of indium tin oxide (ITO), indium zinc oxide (IZO), indium zinc tin oxide (IZTO), indium aluminum zinc oxide (IAZO), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, or Ni/IrOx/Au/ITO, and is not limited thereto.

The first assembly electrode 201, the second assembly electrode 202 emits an electric field as an AC voltage is applied, the semiconductor light emitting device 150 inserted into the assembly hole 203H can be fixed by dielectrophoretic force. A distance between the first assembly electrode 201 and the second assembly electrode 202 can be smaller than a width of the semiconductor light emitting device 150 and a width of the assembly hole 203H, the assembly position of the semiconductor light emitting device 150 using the electric field can be more precisely fixed.

An insulating layer 212 is formed on the first assembly electrode 201 and the second assembly electrode 202 to protect the first assembly electrode 201 and the second assembly electrode 202 from the fluid 1200 and leakage of current flowing through the first assembly electrode 201 and the second assembly electrode 202 can be prevented. For example, the insulating layer 212 can be formed of a single layer or multiple layers of an inorganic insulator such as silica or alumina or an organic insulator. The insulating layer 212 can have a minimum thickness to prevent damage to the first assembly electrode 201 and the second assembly electrode 202 when the semiconductor light emitting device 150 is assembled, and it can have a maximum thickness for the semiconductor light emitting device 150 being stably assembled.

The barrier wall 207 can be formed on the insulating layer 212. A portion of the barrier wall 207 can be positioned on the first assembly electrode 201 and the second assembly electrode 202, and the remaining region can be positioned on the assembly substrate 200.

On the other hand, when the assembly substrate 200 is manufactured, a portion of the barrier walls formed on the entire upper portion of the insulating layer 212 is removed, an assembly hole 203H in which each of the semiconductor light emitting devices 150 is combined and assembled to the assembly substrate 200 can be formed.

An assembly hole 203H to which the semiconductor light emitting devices 150 are coupled is formed in the assembly substrate 200, and a surface on which the assembly hole 203H is formed can be in contact with the fluid 1200. The assembly hole 203H can guide an accurate assembly position of the semiconductor light emitting device 150.

Meanwhile, the assembly hole 203H can have a shape and a size corresponding to the shape of the semiconductor light emitting device 150 to be assembled at a corresponding position. Accordingly, it is possible to prevent assembling other semiconductor light emitting devices or assembling a plurality of semiconductor light emitting devices in the assembly hole 203H.

Referring back to FIG. 6, after the assembly substrate 200 is disposed in the chamber, the assembly device 1100 for applying a magnetic field can move along the assembly substrate 200. The assembly device 1100 can be a permanent magnet or an electromagnet.

The assembly device 1100 can move while in contact with the assembly substrate 200 in order to maximize the area applied by the magnetic field into the fluid 1200. According to an embodiment, the assembly device 1100 can include a plurality of magnetic materials or a magnetic material having a size corresponding to that of the assembly substrate 200. In this case, the moving distance of the assembly device 1100 can be limited within a predetermined range.

The semiconductor light emitting device 150 in the chamber 1300 can move toward the assembly device 1100 and the assembly substrate 200 by the magnetic field generated by the assembly device 1100.

Referring to FIG. 7, the semiconductor light emitting device 150 is moving toward the assembly device 1100, it can enter and be fixed into the assembly hole 203H by a dielectrophoretic force (DEP force) formed by the electric field of the assembly electrode of the assembly substrate.

Specifically, the first and second assembly wirings 201 and 202 can form an electric field by an AC power source, and a dielectrophoretic force can be formed between the assembly wirings 201 and 202 by this electric field. The semiconductor light emitting device 150 can be fixed to the assembly hole 203H on the assembly substrate 200 by this dielectrophoretic force.

At this time, a predetermined solder layer (not shown) is formed between the light emitting device 150 and the assembly electrode assembled on the assembly hole 203H of the assembly substrate 200 to can improve the bonding force of the light emitting device 150.

In addition, a molding layer (not shown) can be formed in the assembly hole 203H of the assembly substrate 200 after assembly. The molding layer can be a transparent resin or a resin including a reflective material and a scattering material.

By the self-assembly method using the electromagnetic field described above, the time required for each of the semiconductor light emitting devices to be assembled on the substrate can be rapidly reduced, so that a large-area high-pixel display can be implemented more quickly and economically.

Figure 8A:
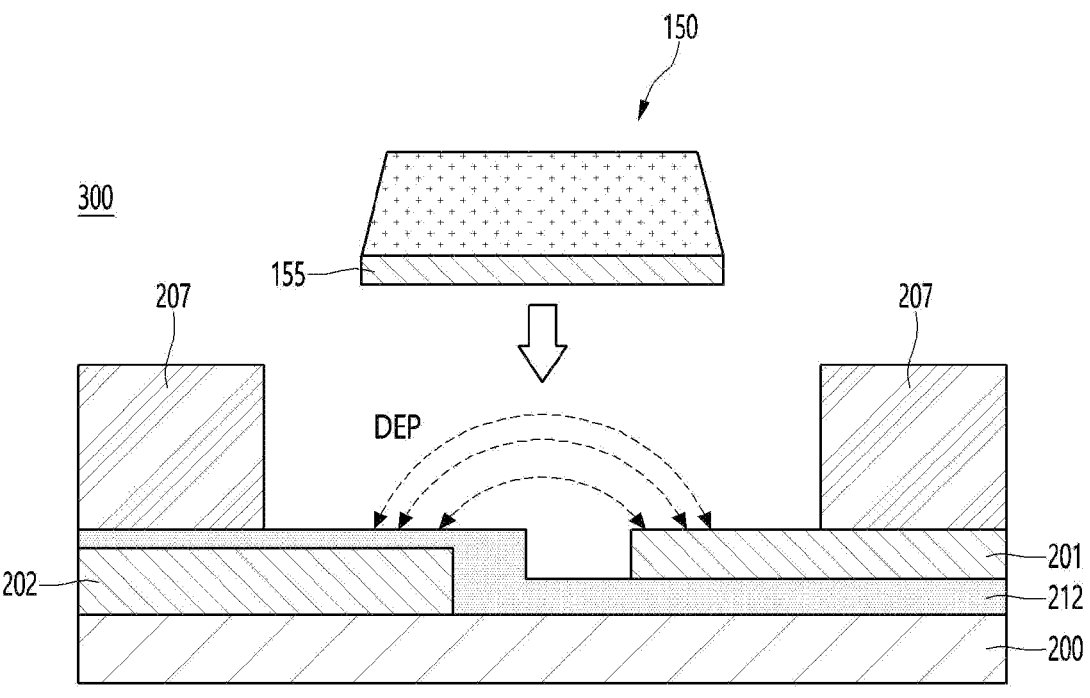
FIGS. 8A to 8B is an example of self-assembly in the display device 300 according to the internal technology.
Figure 8B:
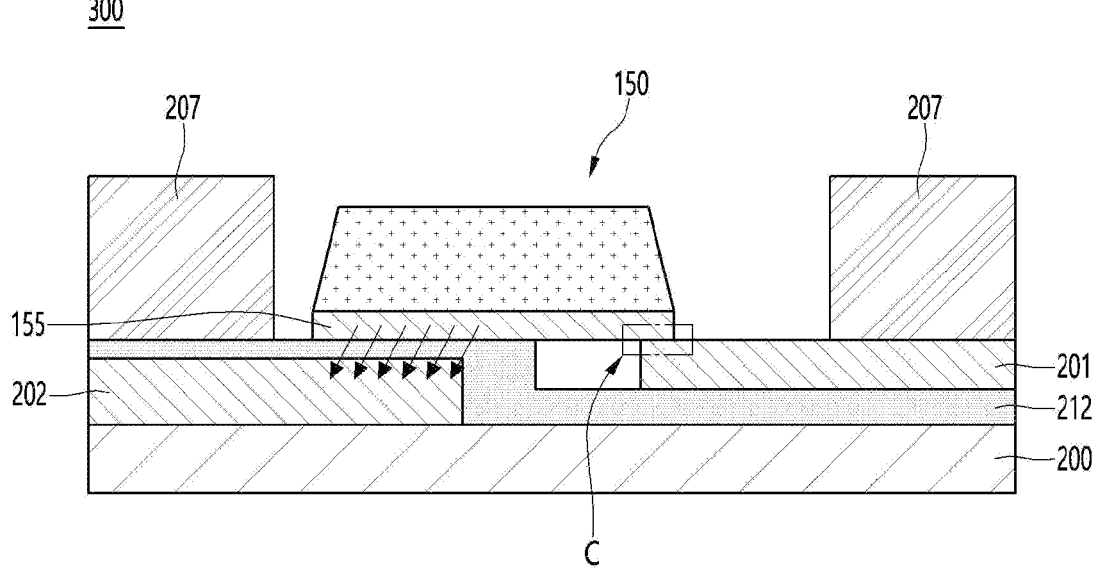
Figure 8C:
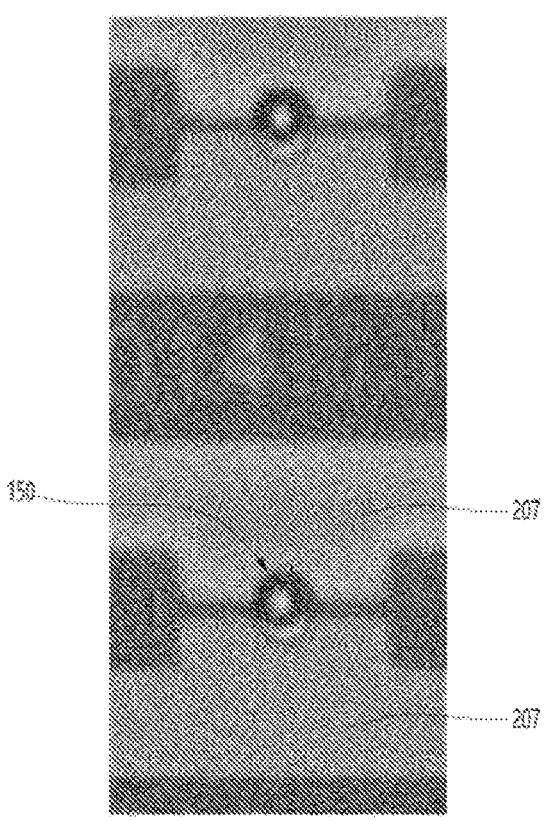
FIG. 8C is a self-assembly picture of the display device according to the internal technology.

Next, FIGS. 8A to 8B are diagrams illustrating self-assembly in the display device 300 according to the internal technology, and FIG. 8C is a picture of self-assembly in the display device according to the internal technology.

In the display device 300 according to the internal technology, either the first assembly electrode 201 or the second assembly electrode 202 is brought into contact with the bonding metal 155 of the semiconductor light emitting device 150 through a bonding process.

However, in order to solve the problem that the bonding area is also reduced as the semiconductor light emitting device 150 is miniaturized, as shown in FIGS. 8A to 8B, a method of omitting the existing Vdd line and completely opening its role to one side of the electrode wiring is used.

However, when this method is used, the semiconductor light emitting device 150 drawn to the first assembly electrode 201 by DEP in the fluid comes into contact with the first assembly electrode 201 and becomes conductive. Accordingly, the electric field force is concentrated on the second assembly electrode 202 that is not opened by the insulating layer 212, and as a result, there is a problem in that the assembling is biased in one direction.

Further, referring to FIGS. 8B and 8C, the contact area C between the bonding metal 155 of the semiconductor light emitting device 150 and the first assembly electrode 201 functioning as a panel electrode is very small, so poor contact may occur.

That is, according to the undisclosed internal technology, even though DEP Force is required for self-assembly, due to the difficulty of uniform control of the DEP force, there is a problem in that the semiconductor light emitting device tilts to a different place in the assembly hole during assembly using self-assembly.

In addition, due to this tilt phenomenon of the semiconductor light emitting device, electrical contact characteristics are lowered in the subsequent electrical contact process, resulting in a defective lighting rate and a lower yield.

Therefore, according to the unpublished internal technology, DEP Force is required for self-assembly, but when using the DEP Force, there is a technical contradiction in that an electrical contact characteristic is reduced due to the tilt phenomenon.

Figure 8D:
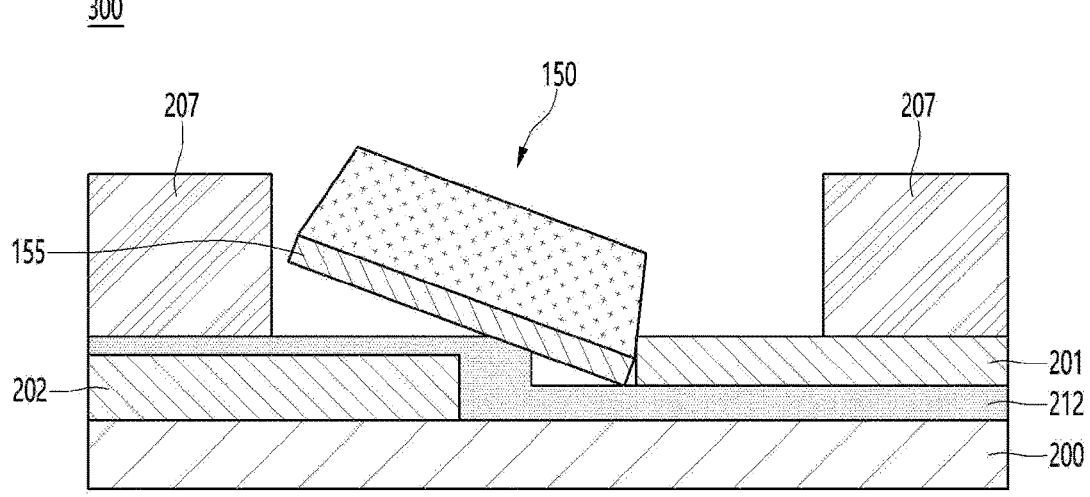
FIG. 8D is a view showing a tilt phenomenon that occurs during self-assembly to the internal technology.
Figure 8E:
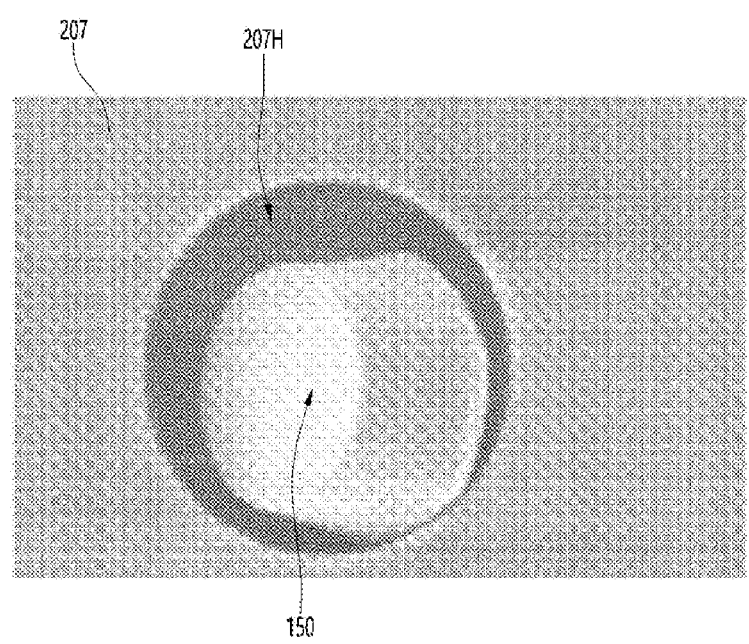
FIG. 8E is a self-assembly picture in the display device according to the internal technology.

Next, FIG. 8D is a diagram illustrating a tilt phenomenon that may occur during self-assembly according to an internal technology, and FIG. 8E is a picture of self-assembly in a display device according to an internal technology.

According to internal technology, an insulating layer 212 is disposed on the first and second assembly electrodes 201 and 202 on the assembly substrate 200, self-assembly by the dielectrophoretic force of the semiconductor light emitting device 150 is performed in the assembly hole 220H set by the assembly and assembly barrier wall 207. However, according to internal technology, the electric field force is concentrated to the second assembly electrode 202, and as a result, there is a problem in that the assembly is biased in one direction, and thus the problem of self-assembly is not properly performed and the problem of tilt in the assembly hole 220H has been studied.

Next, with reference to FIGS. 9 to 13, a display device 301 having a semiconductor light emitting device according to a first embodiment (hereinafter, 'first embodiment' is abbreviated as 'embodiment') will be explained.

Figure 9:
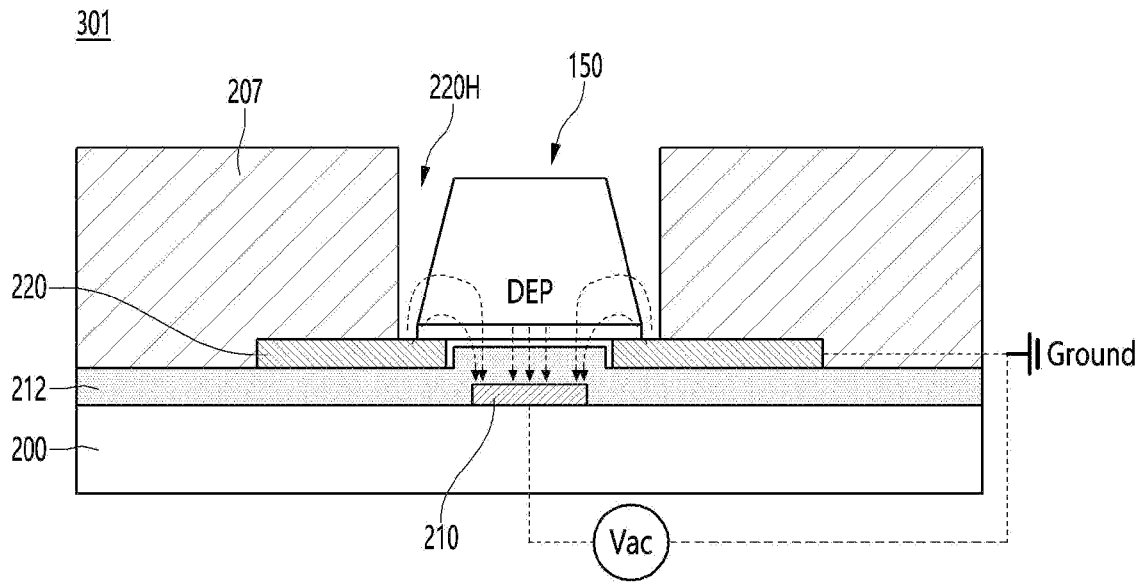
FIG. 9 is a cross-sectional view of a display device 301 including a semiconductor light emitting device according to the first embodiment.

FIG. 9 is a cross-sectional view of a display device 301 including a semiconductor light emitting device according to an embodiment.

Figure 10:
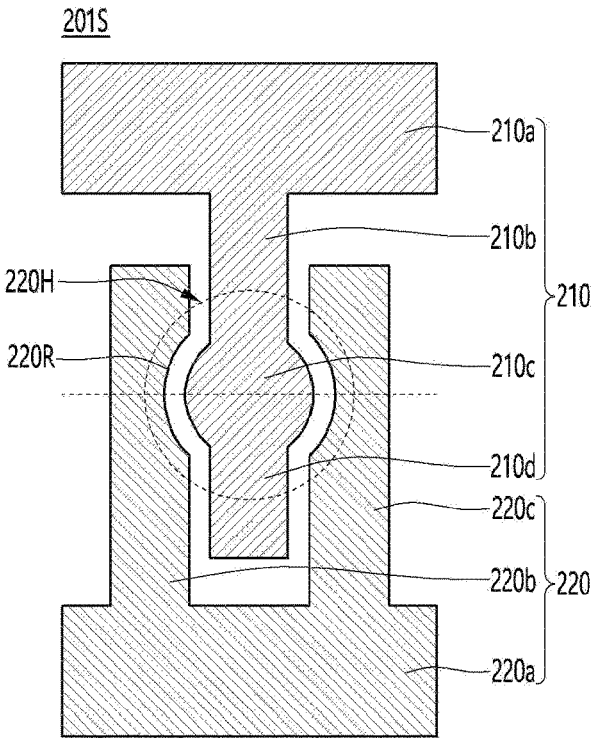
FIG. 10 is an exemplary view of the first assembly electrode structure 201 of the display device 301 including the semiconductor light emitting device according to the first embodiment.

FIG. 10 is an exemplary view of a first assembly electrode structure 201S of a display device 301 including a semiconductor light emitting device according to an embodiment.

On the other hand, in the first internal technology (refer to FIG. 7), in the horizontal assembly electrode structure in which the first assembly electrode and the second assembly electrode are horizontally disposed at the same height, an insulating layer is formed on the upper of electrode. Accordingly, in the case of the first internal technology, when the semiconductor light emitting device is a vertical LED, it is difficult to electrically connect the lower electrode and the assembly electrode of the LED without a separate process. But, as the size of the LED chip becomes smaller, the gap between the horizontal assembly electrode structures is getting smaller, it difficult to form the signal applying electrode, and there is also a problem in that the LED chip is assembled in an inclined state.

On the other hand, in the vertical asymmetric electrode structure (refer to FIG. 8A) according to the second internal technology, the LED light emitting signal can be applied due to the bonding of the first assembly electrode 201 on the insulating layer and the bonding metal 155 of the semiconductor light emitting device. On the other hand, since the assembly electrode structure is asymmetrical, the electric field distribution is also asymmetrically formed, and can be leaned to one side when assembling the semiconductor light emitting device. Also, since the bonding area between the first assembly electrode 201 and the bonding metal 155 on the insulating layer is small, as the size of the light emitting chip becomes smaller, it is difficult to apply a signal.

One of the technical problems of the embodiment is to solve the problem of low self-assembly rate due to non-uniformity of DEP force in the self-assembly method using dielectrophoresis (DEP).

In addition, one of the technical problems of the embodiment is to solve the problem of a screening effect, in which a semiconductor light emitting device to be assembled cannot enter an assembly hole because a semiconductor light emitting device that is not an assembly target blocks the entrance to the assembly hole because the distribution of DEP Force is strongly formed not only inside the assembly hole but also on the upper side of the assembly hole, Referring back to FIG. 9, a display device 301 having a semiconductor light emitting device according to an embodiment can include a substrate 200, a first assembly electrode 210 disposed on the substrate 200, a second assembly electrode 220 disposed above the first assembly electrode 210, an insulating layer 212 disposed between the first assembly electrode 210 and the second assembly electrode 220, an assembly barrier wall 207 including an assembly hole 220H of the second assembly electrode 220, and the semiconductor light emitting device 150 which is disposed in the assembly hole 220H and electrically connected to the second assembly electrode 220.

Next, referring to FIG. 10, the assembly electrode structure 201S according to the first embodiment can include a first assembly electrode in which a portion is located between the branched second assembly electrode 220 and the second assembly electrode 220. The first assembly electrode 210 and the second assembly electrode 220 may not overlap upper and lower.

The second assembly electrode 220 can include the second body electrode part 220a, second-first branch electrode part 220b and a second-second branch electrode part 220c. And the second-first branch electrode part 220b and a second-second branch electrode part 220c are extend from the second body electrode part 220a to the first assembly electrode 210 direction, spaced apart from each other.

The first assembly electrode 210 can include a first body electrode part 210a and a first extended electrode part 210b extending from the first body electrode part 210a to the second assembly electrode 220 direction.

The first extended electrode part 210b can be positioned between the second-first branch electrode part 220b and the second-second branch electrode part 220c.

The first extended electrode part 210b can include a first expanded electrode part 210c. The first expanded electrode part 210c can have a shape corresponding to a horizontal cross-section of the semiconductor light emitting device 150. For example, the first expanded electrode part 210c can have a circular, elliptical, or polygonal shape, but is not limited thereto.

The first extended electrode part 210b can include a first-second extended electrode part 210d extending from the first expanded electrode part 210c to the second body electrode part 220a direction.

In the embodiment, as the first assembly electrode 210 is disposed between the branched second assembly electrodes 220, there is a technical effect that a uniform Dep force can be distributed at the center of the assembly hole to improve the assembly rate.

For example, according to the embodiment, as the inside of the branched second assembly electrode 220 has a curved recess 220R, and the first assembly electrode 210 has the first expanded electrode part 210c corresponding to the curved recess, there is a special technical effect of uniformly concentrating the strong DEP force around the inside circumference of the assembly hole.

According to the embodiment, by controlling the structural shapes of the second assembly electrode 220 and the first assembly electrode 210, the effective electrode area of both ends of the first and second assembly electrodes is larger than the straight assembly electrode structure. So, the capacitance of the assembly electrode can improve and the DEP force can be large, which can increase the assembly force. Through this, there is a technical effect that strong DEP force can be uniformly concentrated around the inner periphery of the assembly hole.

In addition, according to the embodiment, the central region of the first assembly electrode disposed in the assembly hole center can include the first expanded electrode part 210c having a circular, oval or polygonal shape corresponding to the horizontal cross-section of the semiconductor light emitting device.

Through this, even if there is no or weak DEP force on the LED chip and the inclined LED chip enters, the LED chip can slide from the center to the outside, and form a DEP force around the LED chip, and there is a special technical effect that the LED chip can be properly assembled without being inclined in the center of the assembly hole.

In addition, according to the embodiment, since the second assembly electrode 220 is symmetrical about the first assembly electrode 210, the left and right sides of the DEP force are uniform. Also, in alignment with the center of the assembly hole, there is a technical effect that the DEP force can be uniformly applied to the outer shell of the LED chip by forming the shape of the first assembly electrode in a shape corresponding to the horizontal cross section of the semiconductor light emitting device.

Also referring to FIG. 9, in relation to the method of applying an assembly signal to the first assembly electrode 210 and the second assembly electrode 220 in the embodiment, the first assembly electrode 210 and the second assembly electrode 220 can be applied with an AC signal. At this time, the V+/V− signal can be applied to the first assembly electrode 210 as the lower electrode, and the second assembly electrode 220 as the upper electrode can be grounded.

According to the embodiment, when V+/V− voltage is applied to the second assembly electrode 220, which is the upper electrode, current may occur between the lower electrode of the semiconductor light emitting device 150 and the second assembly electrode 220 of the assembly substrate during LED assembly. Through this, voltage drop may be caused and the applied voltage may be decreased.

In this case, the more the LED is assembled in the adjacent cell, the more the voltage drop occurs, and the applied voltage to the assembly part decreases, which may weaken the assembly force.

Therefore, the second assembly electrode 220, which is the upper electrode, is grounded, and the first assembly electrode 210, which is the lower electrode, is applied to V+/V, there is a special effect that a voltage drop is prevented and a high assembly force can maintain.

In particular, the reason for grounding the second assembly electrode 220, which is the upper electrode, in the present invention is to get a special technical effect to minimize the effect of attaching the semiconductor light emitting device to the barrier wall by acting as an electric field shielding in an area other than the assembly area.

For example, according to the embodiment, the distribution of DEP Force can be strongly and uniformly distributed at the inner center of the assembly hole through electric field shielding on the upper side of the assembly hole, and the distribution strength can be controlled weakly on the upper side of the assembly hole. Through this, there is a special technical effect that can prevent a non-assembly semiconductor light emitting device from being located on the upper side of the assembly hole to block the entrance to the assembly hole and can solve the problem of screening effect in which a semiconductor light emitting device to be assembled cannot enter the assembly hole.

According to the electric field (E field) gradient distribution to which the embodiment is applied, the E field (log) on the upper side of the assembly hole of the assembly barrier wall 207 is about 6 (based on log scale), and the E field data is lower about 1,000 times to 10,000 times compared to other internal technology.

Therefore, according to the embodiment, as the V+/V− signal is applied to the first assembly electrode 210, which is the lower electrode, and the second assembly electrode 220 is grounded, which is the upper electrode, a vertical type-symmetrical assembly electrode structure having an electrical shielding effect can be implemented. Accordingly, the E field gradient around the assembly barrier wall can be smaller so that the distribution of the DEP force is strongly and uniformly distributed in the center of the assembly hole, and the strength of the distribution can be controlled small on the upper side of the assembly hole.

So, according to the embodiment, the entrance of the assembly hole cannot be blocked by preventing the non-assembly semiconductor light emitting device from being located on the upper side of the assembly hole. And there is a special technical effect that can significantly increase the assembly yield by concentrating the DEP force on the assembly hole to be uniformly assembled by solving the problem of the screening effect that the semiconductor light emitting device to be assembled cannot enter the assembly hole.

Figure 11A:
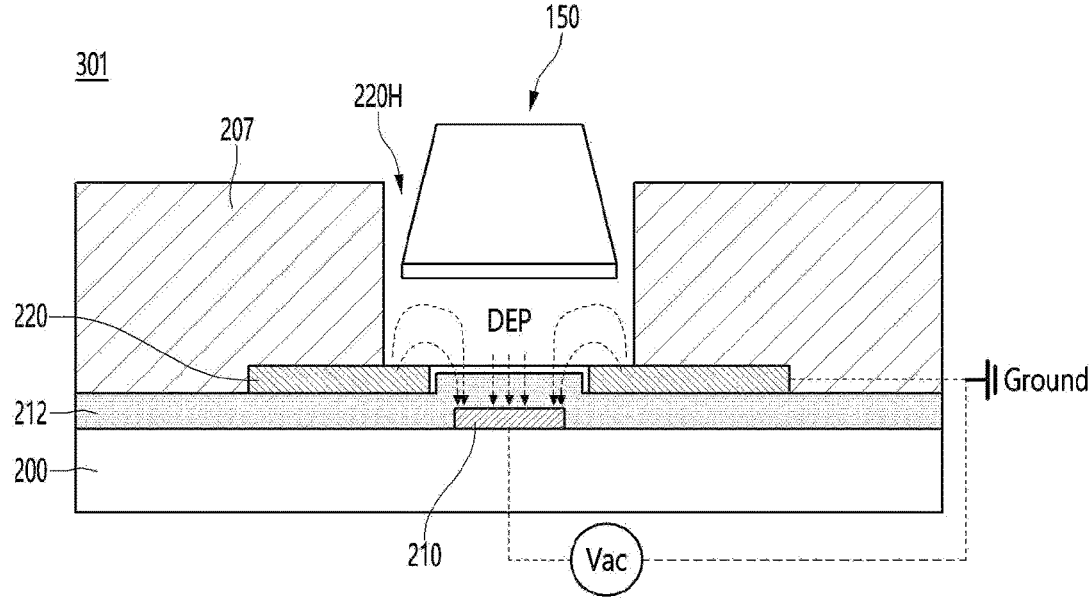
FIGS. 11A to 11B are views illustrating assembly using a display device 301 including an assembly electrode structure 201S of the semiconductor light emitting device display device according to the first embodiment.
Figure 11B:
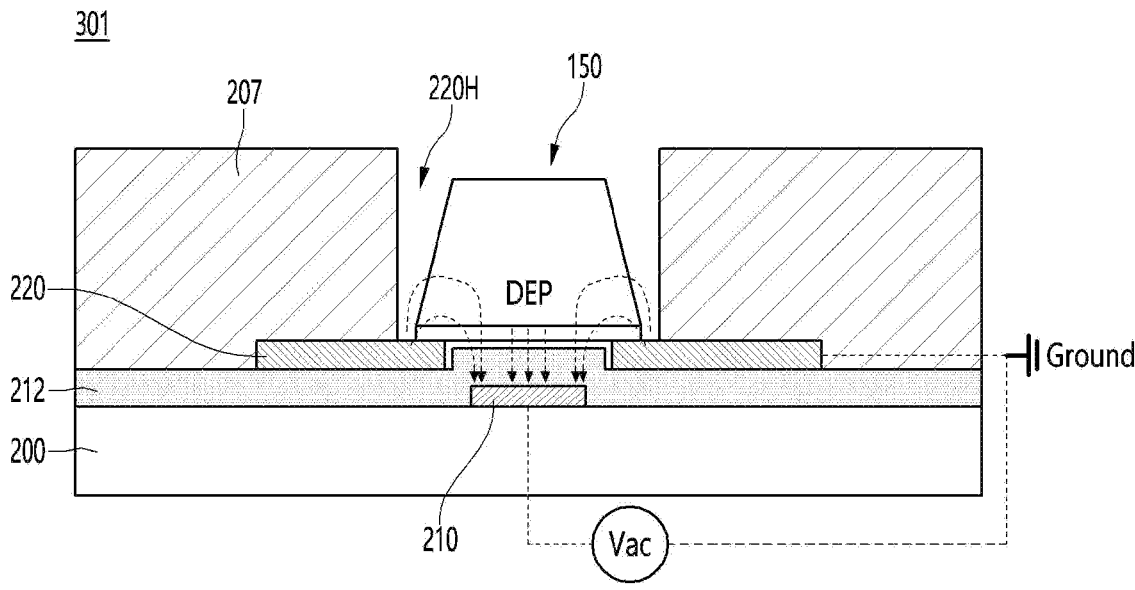
Figure 12:
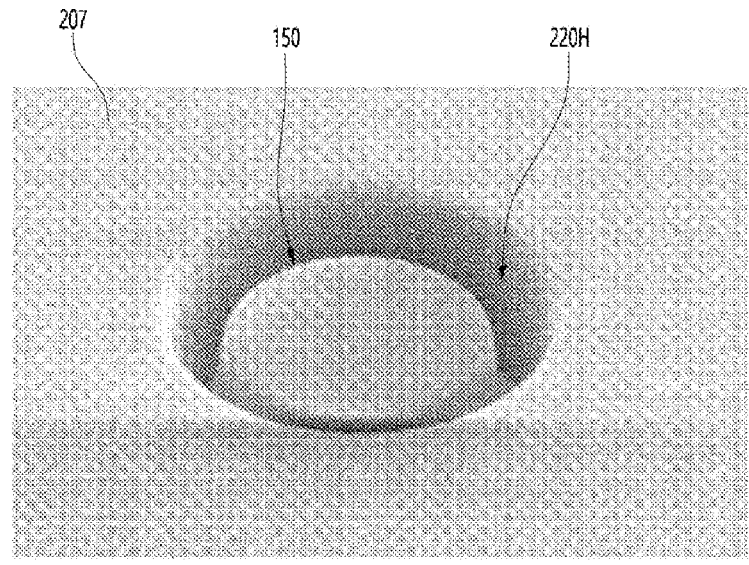
FIG. 12 is a photo self-assembled in the display device according to the first embodiment.

Next, FIGS. 11A to 11B are diagrams illustrating assembly using the display device 301 including the assembly electrode structure 201S of the semiconductor light emitting device display device according to the first embodiment. And FIG. 12 is a photo self-assembled in the display device according to the first embodiment.

Referring to FIGS. 11A to 11B, the semiconductor light emitting device 150 can be positioned on the assembly hole 220H of the display device 301 including the first assembly electrode structure 201S.

In this case, in the first assembly electrode structure 201S of the embodiment, as the first assembly electrode 210 is disposed between the branched second assembly electrodes 220, there is a technical effect of improving assembly rate be ensured by a uniform Dep force is distributed in the assembly hole center.

In addition, according to the embodiment, since the second assembly electrode 220 is symmetrical about the first assembly electrode 210, the left and right sides of the DEP force are uniform. Also, in alignment with the center of the assembly hole, there is a technical effect that the DEP force can be uniformly applied to the outer shell of the LED chip by forming the shape of the first assembly electrode in a shape corresponding to the horizontal cross section of the semiconductor light emitting device.

In addition, according to the embodiment, the central region of the first assembly electrode disposed in the assembly hole center can include the first expanded electrode part 210c having a circular, oval or polygonal shape corresponding to the horizontal cross-section of the semiconductor light emitting device.

Through this, even if there is no or weakly applied DEP force to the LED chip and the inclined LED chip enters, the LED chip can slide from the center to the outside as shown in FIG. 12 and form a DEP force around the LED chip. Also, there is a special technical effect that the LED chip is properly assembled without being inclined in the center of the assembly hole.

In addition, according to the embodiment, as the V+/V− signal is applied to the first assembly electrode 210, which is the lower electrode, and the second assembly electrode, which is the upper electrode, is grounded, there is a special technical effect that can prevent voltage drop and maintain high assembly force.

In addition, according to the embodiment, the distribution of DEP Force can be strongly and uniformly distributed at the inner center of the assembly hole through electric field shielding on the upper side of the assembly hole, and the distribution strength can be controlled weakly on the upper side of the assembly hole. Through this, there is a special technical effect that can prevent a non-assembly semiconductor light emitting device from being located on the upper side of the assembly hole to block the entrance to the assembly hole and can solve the problem of screening effect in which a semiconductor light emitting device to be assembled cannot enter the assembly hole.

Figure 13:
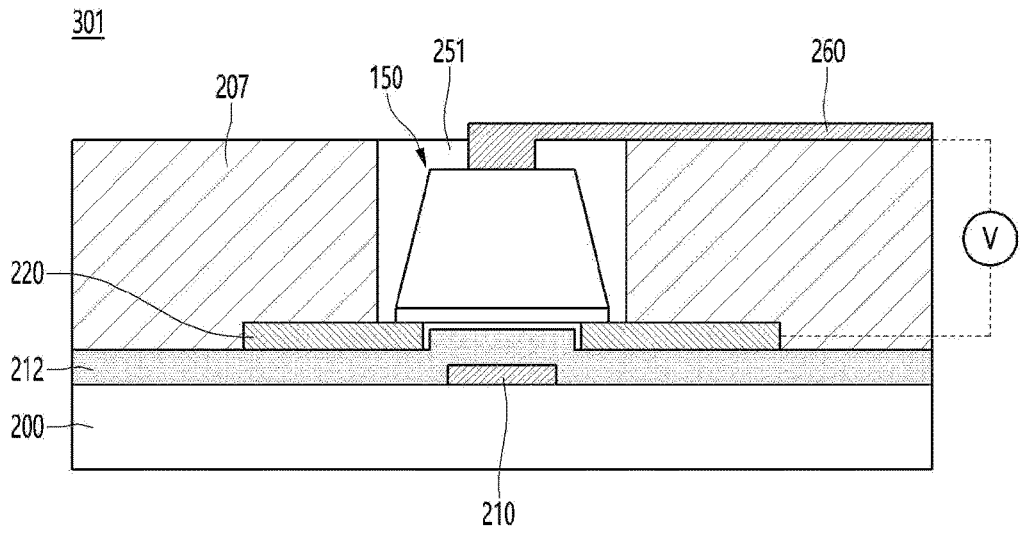
FIG. 13 is a cross-sectional view of a display device 301 including an assembly electrode structure 201S of a semiconductor light emitting device display device.

Next, FIG. 13 is a cross-sectional view of the display device 301 including the assembly electrode structure 201S of the semiconductor light emitting device display device.

Referring to FIG. 13, a predetermined light-transmitting resin 251 can be filled in the assembly hole 220H, and a second panel wiring 260 can be formed electrically connected to the semiconductor light emitting device 150.

In the embodiment, there is a technical effect that the electrical contact characteristics are improved by widening the electrical contact area of the second assembly electrode 220 that can function as a panel electrode to the electrode of the semiconductor light emitting device so that, the lighting rate is significantly increased.

In addition, according to the embodiment, there is a technical effect capable of realizing an ultra-high resolution by three-dimensionally disposing the first assembly electrode and the second assembly electrode between the upper and lower.

Figure 14:
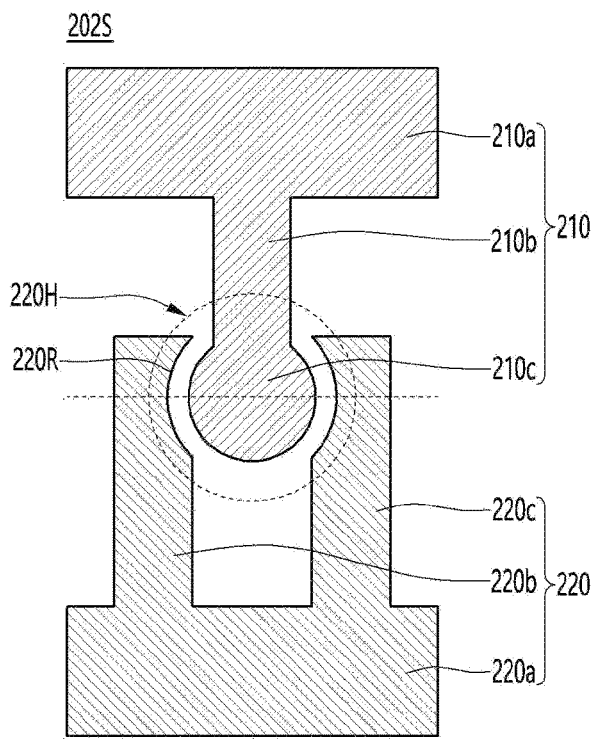
FIG. 14 is a plan view of a second assembly electrode structure 202S of a semiconductor light emitting device display device.

Next, FIG. 14 is a plan view of the second assembly electrode structure 202S of the semiconductor light emitting device display device.

The second assembly electrode structure 202S can adopt the technical characteristics of the first assembly electrode structure 201S described above.

In the second assembly electrode structure 202S, the second assembly electrode 220 can include the second body electrode part 220*a*, second-first branch electrode part 220*b* and a second-second branch electrode part 220*c*. And second-first branch electrode part 220*b* and a second-second branch electrode part 220*c* can be extended from the second body electrode part 220*a* to the first assembly electrode 210 direction, spaced apart from each other.

In the second assembly electrode structure 202S, the first assembly electrode 210 can include the first body electrode part 210*a* and first extended electrode part 210*b* which is extended from the first body electrode part 210*a* to the second assembly electrode 220 direction. The first extended electrode part 210*b* can be positioned between the second-first branch electrode part 220*b* and the second-second branch electrode part 220*c*.

The first extended electrode part 210*b* can include a first expanded electrode part 210*c*. The first expanded electrode part 210*c* can have a shape corresponding to a horizontal cross-section of the semiconductor light emitting device 150. For example, the first expanded electrode part 210*c* can have a circular, elliptical, or polygonal shape, but is not limited thereto.

In the embodiment, as the first assembly electrode 210 is disposed between the branched second assembly electrodes 220, there is a technical effect that a uniform Dep force is distributed at the center of the assembly hole to improve the assembly rate.

For example, according to an embodiment, the inside of the branched second assembly electrode has a curved recess 220R, and the first assembly electrode has the expanded electrode part 210*c* corresponding to the curved recess, so that there is special technical effect that a strong DEP force can be uniformly concentrated around the inner periphery of the assembly hole.

Figure 15:
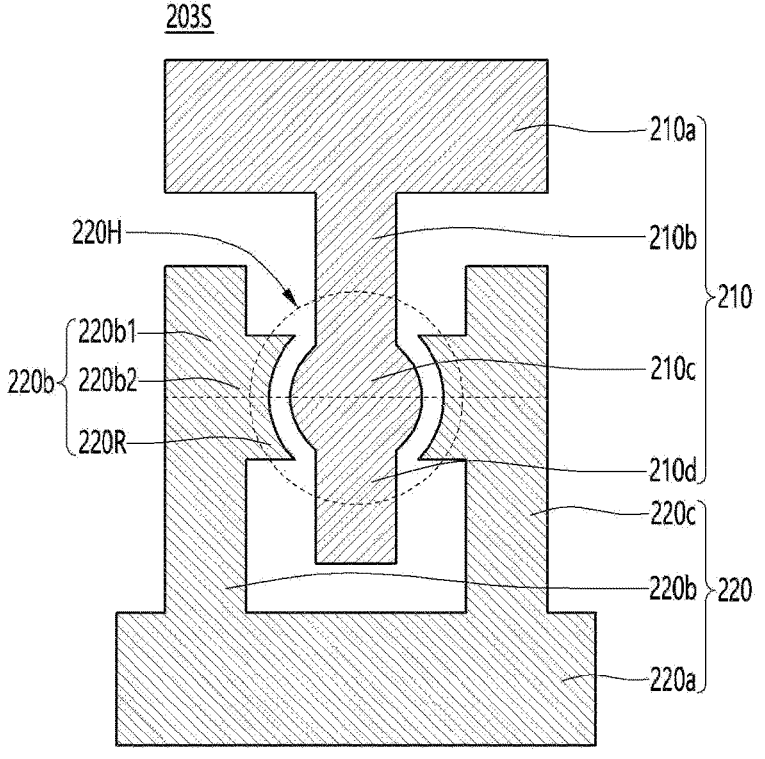
FIG. 15 is a plan view of a third assembly electrode structure 203S of a semiconductor light emitting device display device.

Next, FIG. 15 is a plan view of the third assembly electrode structure 203S of the semiconductor light emitting device display device.

The third assembly electrode structure 203S can adopt the technical characteristics of the first assembly electrode structure 201S described above.

In the second assembly electrode structure 203S, the second assembly electrode 220*b* can include the second body electrode part 220*a*, second-first branch electrode part 220*b* and a second-second branch electrode part 220*c*. And the second-first branch electrode part 220*b* and the second-second branch electrode part 220*c* can be extended from the second body electrode part 220*a* to the first assembly electrode 210 direction, spaced apart from each other.

The second-first branch electrode part 220*b* or the second-second branch electrode part 220*c* can include the second branch body part 220*b*1, a second branch protrusion 220*b*2 extending from the second branch body 220*b*1 in the direction of the first extended electrode part 210*b*, and a second recess part 220*r* corresponding to the shape of the first expanded electrode part 210*c*.

In the embodiment, the distance between the second-first branch electrode part 220*b* or the second-second branch electrode part 220*c* is far from the respective second branch body parts 220*b*1, and the second branch protrusion part 220*b*2 is disposed at a position where the DEP force will be formed, and by including the second recess part 220R corresponding to the shape of the first extended electrode part 210*c*, there is a special technical effect of uniformly concentrating the strong DEP force around the center of the assembly hole and the inner circumference of the assembly hole.

Figure 16:
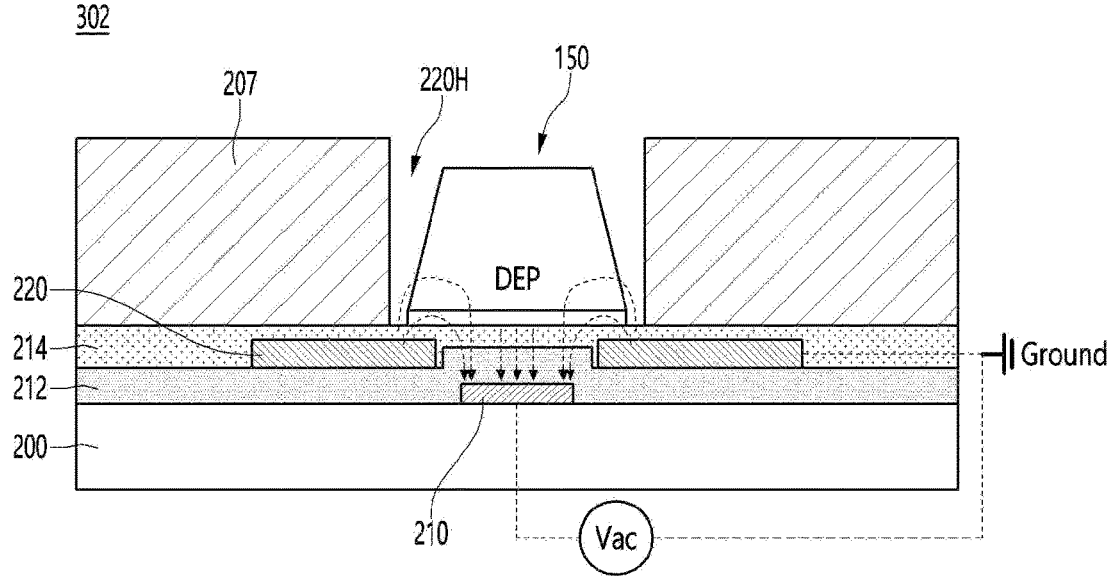
FIG. 16 is a cross-sectional view of a display device 302 including a semiconductor light emitting device according to a second embodiment.

Next, FIG. 16 is a cross-sectional view of the display device 302 including the semiconductor light emitting device according to the second embodiment. And FIG. 17 is an exemplary diagram of a first assembly electrode structure 201S of a display device 302 including a semiconductor light emitting device according to a second embodiment.

The display device 302 including the semiconductor light emitting device according to the second embodiment can employ the technical features of the display device 301 including the semiconductor light emitting device according to the first embodiment described above. Hereinafter, the main features of the second embodiment will be mainly described.

Referring to FIG. 16, the display device 302 of the semiconductor light emitting device according to the second embodiment can include a substrate 200, a first assembly electrode 210 disposed on the substrate 200, a second assembly electrode 220 disposed above the first assembly electrode 210, an insulating layer 212 disposed between the first assembly electrode 210 and the second assembly electrode 220, a second insulating layer 214 disposed on the insulating layer 212 and second assembly electrode 220, an assembly barrier wall 207 including a predetermined assembly hole 220H and disposed on the second insulating layer 214, and a semiconductor light emitting device 150 disposed in the assembly hole 220H.

Figure 17:
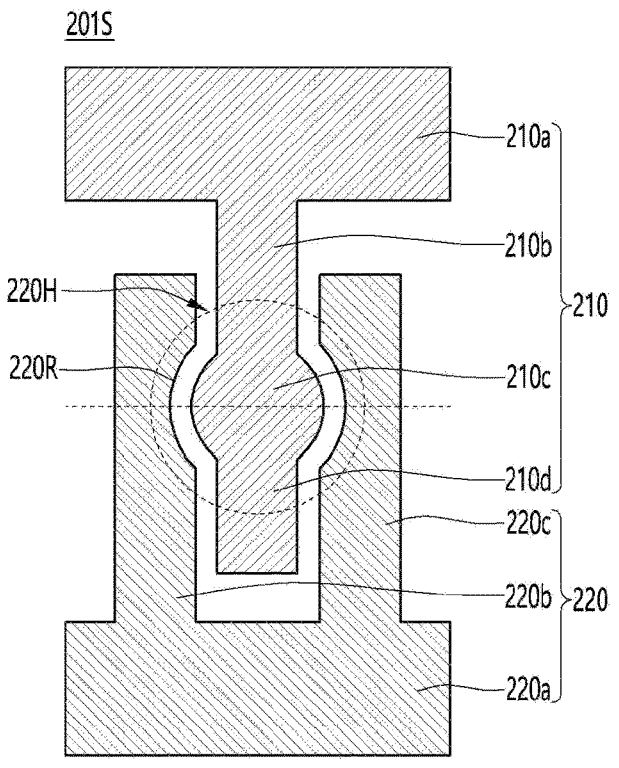
FIG. 17 is an exemplary view of a first assembly electrode structure 201 of a display device 302 including a semiconductor light emitting device according to a second embodiment.

Next, referring to FIG. 17, the assembly electrode structure 201S according to the second embodiment can include the branched second assembly electrode 220 and the first assembly electrode 210 partially positioned between the second assembly electrode 220. The first assembly electrode 210 and the second assembly electrode 220 may not overlap upper and lower.

Figure 18A:
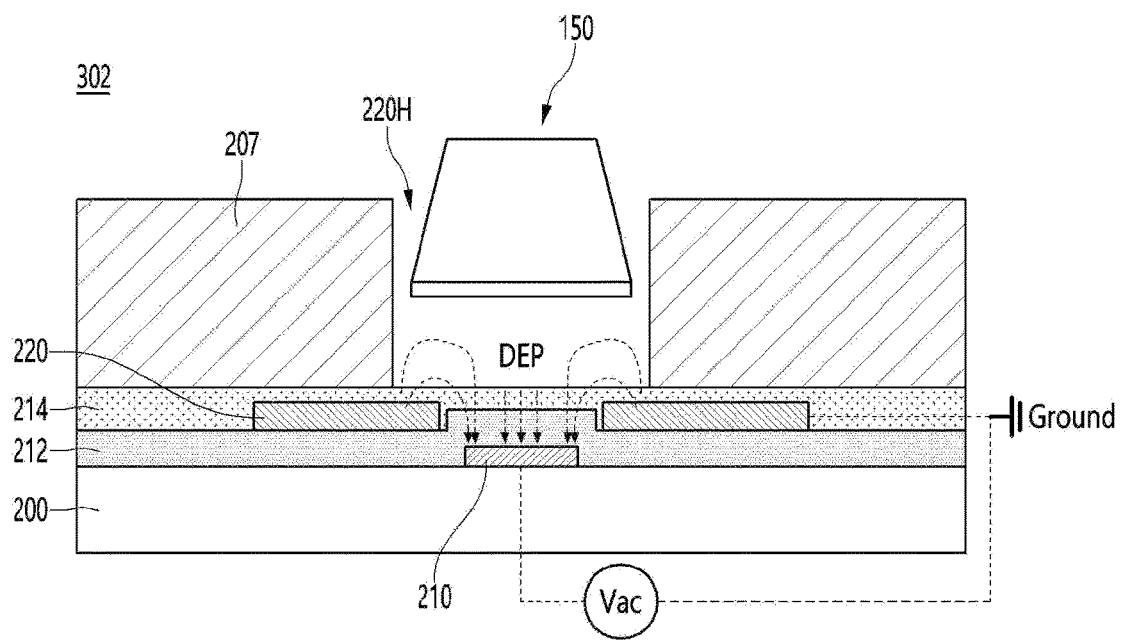
FIGS. 18A to 18B are views illustrating assembly using a semiconductor light emitting device display device 302 according to a second embodiment.
Figure 18B:
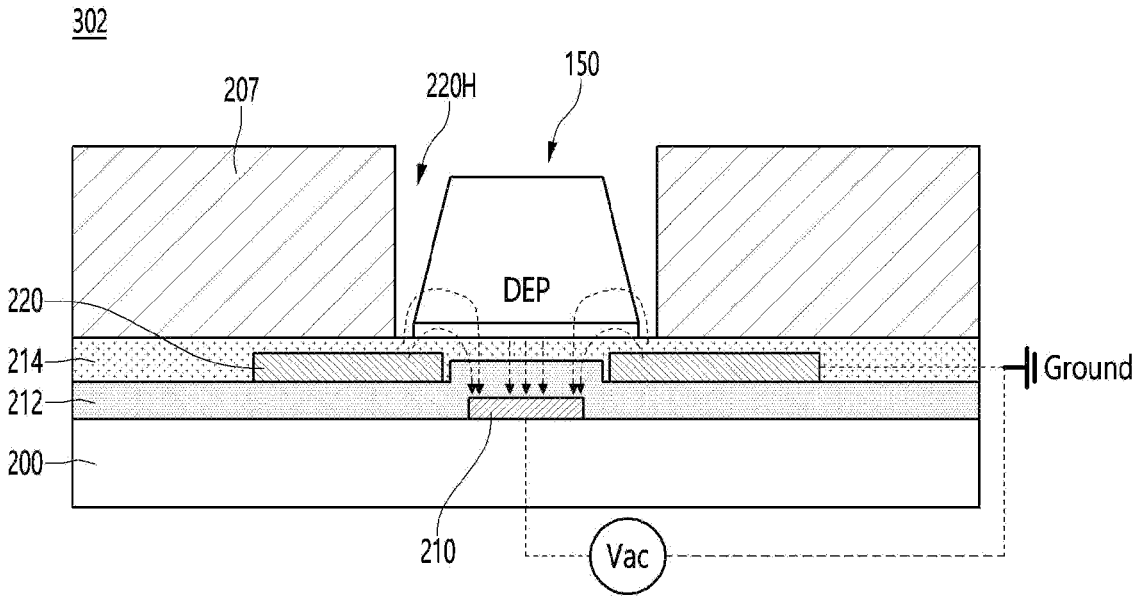
Figure 19:
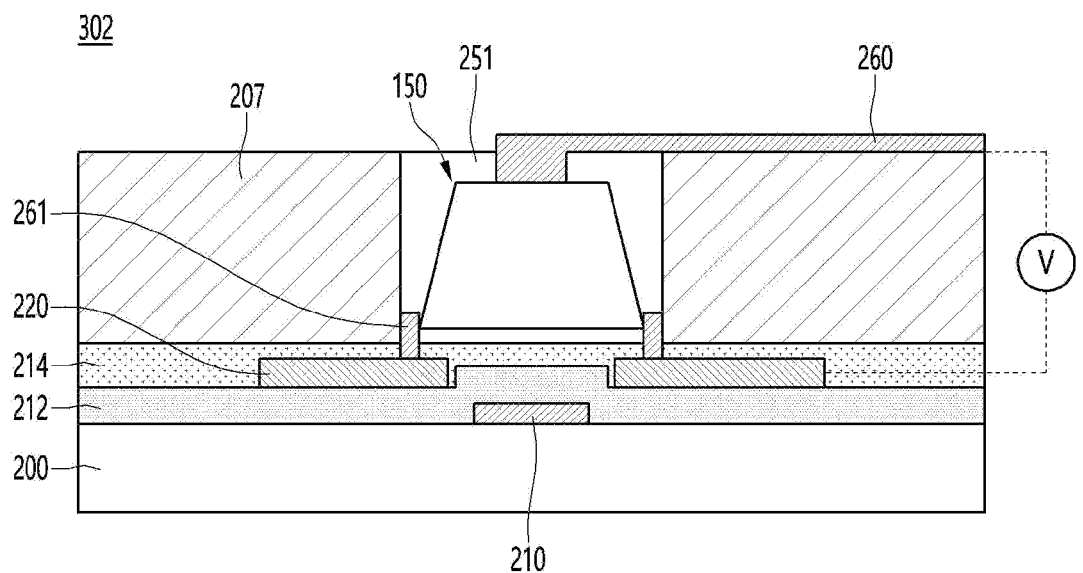
FIG. 19 is a cross-sectional view of a semiconductor light emitting device display device 302 according to a second embodiment.

Next, FIGS. 18A to 18B are diagrams illustrating assembly using the semiconductor light emitting device display device 302 according to the second embodiment. And FIG. 19 is a cross-sectional view of the semiconductor light emitting device display device 302 according to the second embodiment.

Referring to FIGS. 18A to 18B, the semiconductor light emitting device 150 can be positioned on the assembly hole 220H of the semiconductor display device 302 according to the second exemplary embodiment.

According to the embodiment, as the first assembly electrode 210 is disposed between the branched second assembly electrodes 220, a uniform Dep force is distributed at the center of the assembly hole, and there is a technical effect of improving the normal assembly rate.

In addition, according to the second embodiment, since the second assembly electrode 220 is symmetrical about the first assembly electrode 210, the DEP force is uniform on the left and right, and the shape of the first assembly electrode is manufactured in a circle, oval or polygonal shape according to the center of the assembly hole, and there is a technical effect that the DEP force can be uniformly applied to the outer shell of the LED chip.

In addition, according to the embodiment, as the V+/V− signal is applied to the first assembly electrode 210, which is the lower electrode, and the second assembly electrode 220, which is the upper electrode, is grounded, there is a special technical effect that can prevent voltage drop and maintain high assembly force.

For example, according to the embodiment, the distribution of DEP Force can be strongly and uniformly distributed at the inner center of the assembly hole through electric field shielding on the upper side of the assembly hole, and the distribution strength can be controlled weakly on the upper side of the assembly hole. Through this, there is a special technical effect that can prevent a non-assembly semiconductor light emitting device from being located on the upper side of the assembly hole to block the entrance to the assembly hole and can solve the problem of screening effect in which a semiconductor light emitting device to be assembled cannot enter the assembly hole.

Next, referring to FIG. 19, a portion of the second insulating layer 214 can be removed to expose a top surface of the second assembly electrode 220. Thereafter, a connection electrode 261 connecting the exposed upper surface of the second assembly electrode 220 and one side of the semiconductor light emitting device 150 can be formed.

After this, a predetermined light-transmitting resin 251 can be filled in the assembly hole 220H, and a second panel wiring 260 electrically connected to the semiconductor light emitting device 150 can be formed.

Figure 20:
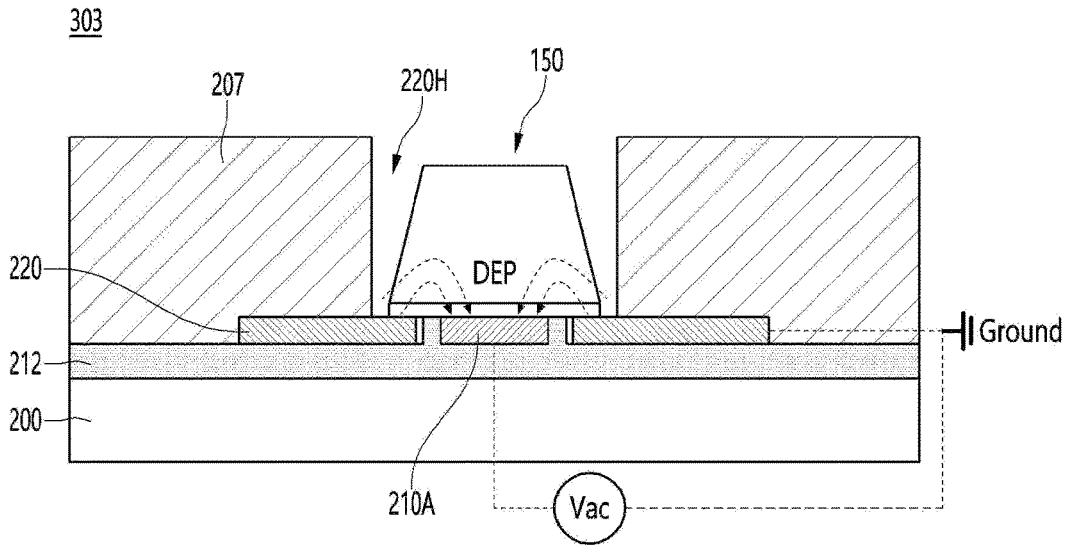
FIG. 20 is a cross-sectional view of a display device 303 having a semiconductor light emitting device according to a third embodiment.
Figure 21:
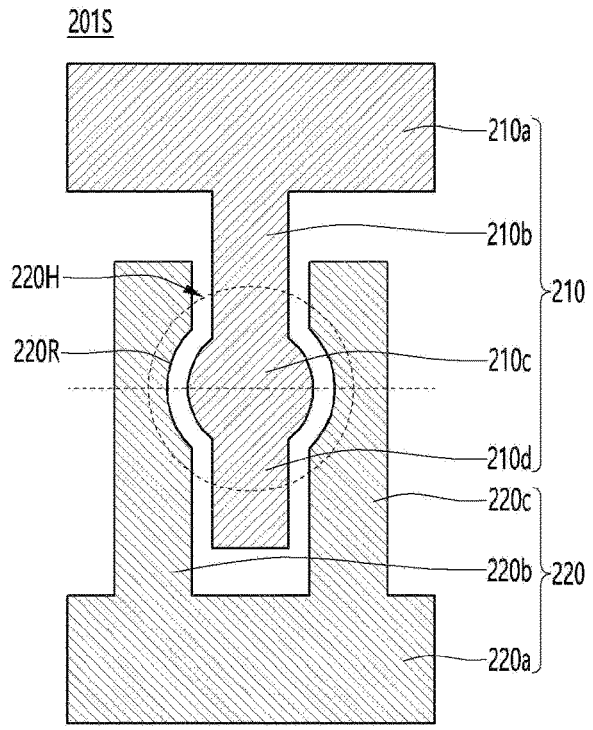
FIG. 21 is an exemplary view of a first assembly electrode structure 201S of a display device 303 including a semiconductor light emitting device according to a third embodiment.

Next, FIG. 20 is a cross-sectional view of a display device 303 including a semiconductor light emitting device according to a third embodiment. And FIG. 21 is an exemplary diagram of a first assembly electrode structure 201S of a display device 303 including a semiconductor light emitting device according to a third embodiment.

The display device 303 having a semiconductor light emitting device according to the third embodiment can adopt a technical feature of the display devices 301 and 302 including the semiconductor light emitting device according to the first or second embodiment described above. Hereinafter, the main features of the third embodiment will be mainly described.

Referring to FIG. 20, a display device 303 having a semiconductor light emitting device according to the third embodiment can include a substrate 200, a second assembly electrode disposed on the substrate 200 and arranged to be branched, a first assembly electrode 210A disposed between the second assembly electrodes 220, a first assembly electrode 210A disposed between the second assembly electrodes 220, an insulating layer 212 disposed between the first assembly electrode 210A and the assembly barrier wall 207 including a predetermined assembly hole 220H and disposed on the second assembly electrode 220 and the insulating layer 212, and the semiconductor light emitting device 150 disposed in the assembly hole 220H.

The first assembly electrode 210A and the second assembly electrode 220 can be disposed at the same height in the horizontal direction.

Next, referring to FIG. 21, in the assembly electrode structure 201S according to the embodiment can be include the first assembly electrode 201A in which a portion is positioned between the branched second assembly electrode 220 and the second assembly electrode 220. The first assembly electrode 210A and the second assembly electrode 220 may not overlap vertically.

Figure 22A:
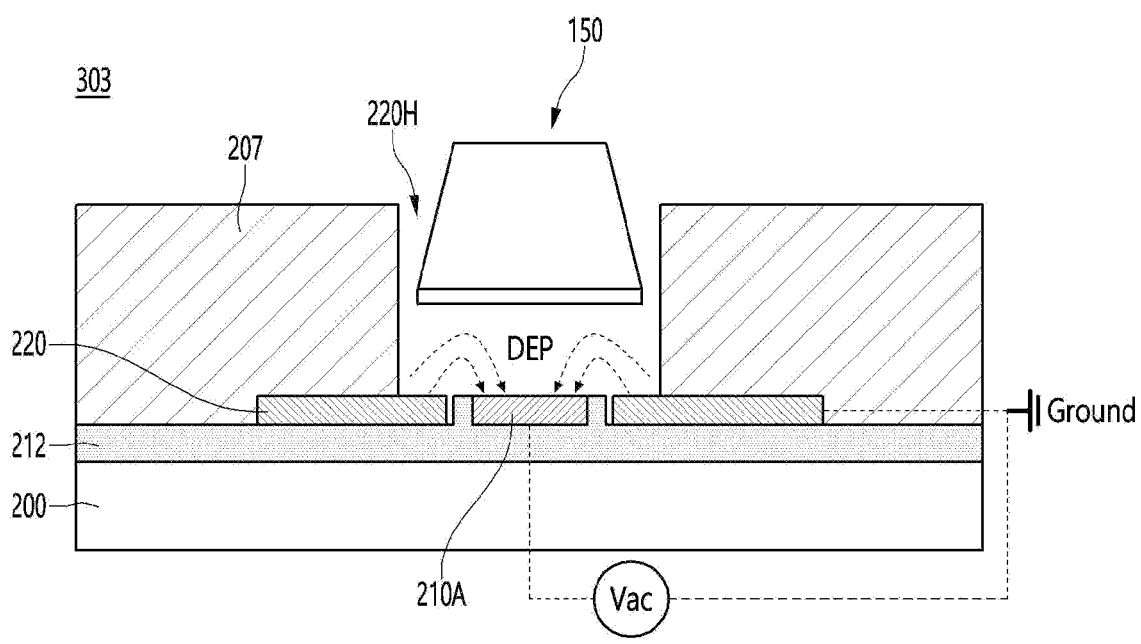
FIGS. 22A to 22B are views illustrating assembly using the semiconductor light emitting device display device 303 according to the third embodiment.
Figure 22B:
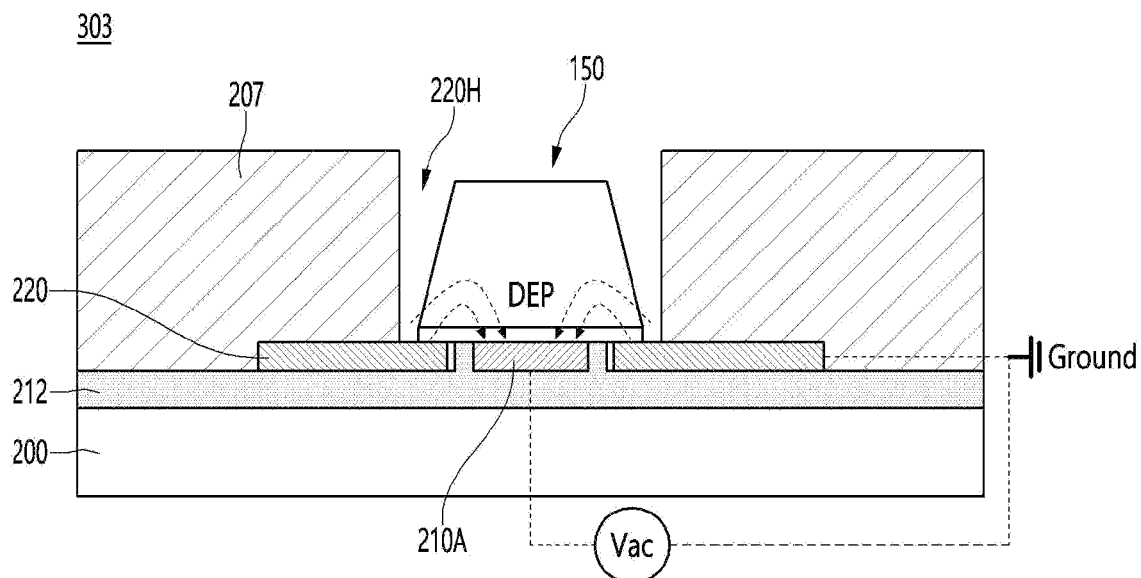
Figure 23:
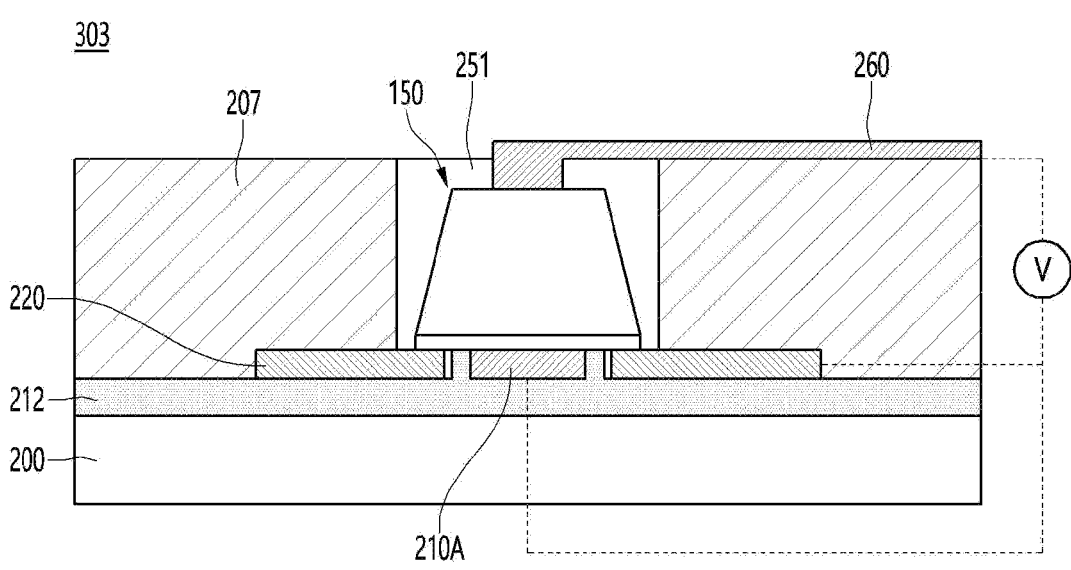
FIG. 23 is a cross-sectional view of a semiconductor light emitting device display device 303 according to a third embodiment.

Next, FIGS. 22A to 22B are diagrams illustrating assembly using the semiconductor light emitting device display device 303 according to the third embodiment. And FIG. 23 is a cross-sectional view of the semiconductor light emitting device display device 303 according to the third embodiment.

Referring to FIGS. 22A to 22B, the semiconductor light emitting device 150 can be positioned on the assembly hole 220H of the semiconductor display device 303 according to the third exemplary embodiment.

According to the embodiment, as the first assembly electrode 210A is disposed between the branched second assembly electrodes 220, a uniform Dep force is distributed in the center of the assembly hole, and the technical effect of improving the assembly rate is obtained.

In addition, according to the embodiment, since the second assembly electrode 220 is symmetrical about the first assembly electrode 210, the DEP force is uniform on the left and right, and the shape of the first assembly electrode is manufactured in a circle, oval or polygonal shape according to the center of the assembly hole, and there is a technical effect that the DEP force can be uniformly applied to the outer shell of the LED chip.

In addition, according to the embodiment, as the V+/V− signal is applied to the first assembly electrode 210, and the second assembly electrode, is grounded, there is a special technical effect that can prevent voltage drop and maintain high assembly force.

For example, according to the embodiment, the distribution of DEP Force can be strongly and uniformly distributed at the inner center of the assembly hole through electric field shielding on the upper side of the assembly hole, and the distribution strength can be controlled weakly on the upper side of the assembly hole. Through this, there is a special technical effect that can prevent a non-assembly semiconductor light emitting device from being located on the upper side of the assembly hole to block the entrance to the assembly hole and can solve the problem of screening effect in which a semiconductor light emitting device to be assembled cannot enter the assembly hole.

Next, referring to FIG. 23, a predetermined light-transmitting resin 251 can be filled in the assembly hole 220H. And a second panel wiring 260 electrically connected to the semiconductor light emitting device 150 can be formed.

At this time, according to the embodiment, there is a technical effect that the first assembly electrode 210A and the second assembly electrode 220 are opposite to the second panel wiring 260 and have the same polarity and can function as a first panel wiring.

Accordingly, according to the embodiment, as the contact area between the semiconductor light emitting device 150 and the first panel wiring is remarkably increased, carrier injection efficiency is improved, and there is a special technical effect in which the luminance of the semiconductor light emitting device display is remarkably improved.

According to the assembly substrate structure of the semiconductor light emitting device display device according to the embodiment and the display device including the same, in the self-assembly method using dielectrophoresis (DEP), there is a technical effect that can solve the problem of low self-assembly rate due to non-uniformity of DEP force.

According to the embodiment, by controlling the structural shapes of the second assembly electrode 220 and the first assembly electrode 210, the effective electrode area of both ends of the first and second assembly electrodes is larger than the straight assembly electrode structure. So, the capacitance of the assembly electrode can be improved and the DEP force can be large, which can increase the assembly force. Through this, there is a technical effect that strong DEP force can be uniformly concentrated around the inner periphery of the assembly hole.

In addition, according to the embodiment, the central region of the first assembly electrode disposed in the assembly hole center can be formed of a metal having a shape corresponding to the horizontal cross-sectional shape (eg, circular, oval, or polygonal) of the LED chip. Through this, even if there is no or weak DEP force on the LED chip and the inclined LED chip enters, the LED chip can slide from the center to the outside to form a DEP force around the LED chip, and there is a special technical effect that the LED chip is properly assembled without being tilted in the center of the assembly hole.

In addition, according to the embodiment, since the second assembly electrode is symmetrical about the first assembly electrode, the DEP force is uniform on the left and right, and the shape of the first assembly electrode is manufactured in a circle, oval or polygonal shape according to the center of the assembly hole, and there is a technical effect that the DEP force can be uniformly applied to the outer shell of the LED chip.

In addition, according to the embodiment, as the V+/V− signal is applied to the first assembly electrode 210, which is the lower electrode, and the second assembly electrode 220, which is the upper electrode, is grounded, there is a special technical effect that can prevent voltage drop and maintain high assembly force.

For example, according to the embodiment, the distribution of DEP Force can be strongly and uniformly distributed at the inner center of the assembly hole through electric field shielding on the upper side of the assembly hole, and the distribution strength can be controlled weakly on the upper side of the assembly hole. Through this, there is a special technical effect that can prevent a non-assembly semiconductor light emitting device from being located on the upper side of the assembly hole to block the entrance to the assembly hole and can solve the problem of screening effect in which a semiconductor light emitting device to be assembled cannot enter the assembly hole.

In addition, according to the embodiment, there is a technical effect capable of realizing an ultra-high resolution by three-dimensionally disposing the first assembly electrode and the second assembly electrode between the upper and lower.

In addition, according to the embodiment, there is a technical effect that the first assembly electrode 210A and the second assembly electrode 220 can have the same polarity which is opposite to the second panel wiring 260, and can function as a first panel wiring.

Accordingly, according to the embodiment, as the contact area between the semiconductor light emitting device 150 and the first panel wiring is remarkably increased, carrier injection efficiency is improved, and there is a special technical effect in which the luminance of the semiconductor light emitting device display is remarkably improved.

The above detailed description should not be construed as restrictive in all respects and should be considered as exemplary. The scope of the embodiments should be determined by a reasonable interpretation of the appended claims, and all modifications within the equivalent scope of the embodiments are included in the scope of the embodiments.

INDUSTRIAL APPLICABILITY

The embodiment can be applied in the field of display for displaying images or information.

The embodiment can be applied to a display field for displaying images or information using a semiconductor light emitting device.

The embodiment can be applied in a display field for displaying images or information using micro-scale or nano-level semiconductor light emitting devices.

What is claimed is:

1. A display device comprising:

a substrate;

a first assembly electrode disposed on the substrate;

a second assembly electrode branched and disposed above the first assembly electrode;

an insulating layer disposed between the first assembly electrode and the second assembly electrode;

an assembly barrier wall including an assembly hole and disposed on the second assembly electrode; and a semiconductor light emitting device disposed in the assembly hole, electrically connected to the second assembly electrode, wherein the second assembly electrode comprises a second body electrode part, and a second-first branch electrode part, a second-second branch electrode part extending from the second body electrode part in a direction of the first assembly electrode and spaced apart from each other, wherein the first assembly electrode is disposed between the second-first branch electrode part and the second-second branch electrode part, wherein the first assembly electrode comprises a first body electrode part and a first extended electrode part extending from the first body electrode part in a direction of a second assembly electrode part, wherein the first extended electrode part is disposed between the second-first branch electrode part and the second-second branch electrode part, wherein the first extended electrode part comprises a first expanded electrode part having a shape corresponding to a horizontal cross-section of the semiconductor light emitting device, and wherein the first extended electrode part comprises a first-second extended electrode part extending from the first expanded electrode part in a direction of the second body electrode part.

2. The display device according to claim 1, wherein the first assembly electrode and the second assembly electrode do not vertically overlap each other.

3. The display device according to claim 1, wherein the second-first branch electrode part or the second-second branch electrode part comprises a curved recess in its inner side, wherein the first expanded electrode part has a shape corresponding to the curved recess.

4. The display device according to claim 3, wherein the second-first branch electrode part or the second-second branch electrode part comprises a second branch body part, a second branch protrusion extending from the second branch body part in a direction of the first extended electrode part and a second recess corresponding to the shape of the first expanded electrode part in the second branch protrusion.

5. The display device according to claim 1, wherein a V+/V− signal is applied to the first assembly electrode, and the second assembly electrode is grounded.

6. A display device having a semiconductor light emitting device, the display device comprising:

a substrate;

a first assembly electrode disposed on the substrate;

a second assembly electrode disposed on the first assembly electrode;

an insulating layer disposed between the first assembly electrode and the second assembly electrode;

a second insulating layer disposed on the second assembly electrode and the insulating layer;

an assembly barrier wall including an assembly hole and disposed on the second assembly electrode;

the semiconductor light emitting device disposed in the assembly hole; and a connection electrode connecting an upper surface of the second assembly electrode exposed by removing a portion of the second insulating layer and one side of the semiconductor light emitting device.

7. The display device having the semiconductor light emitting device according to claim 6, wherein the second assembly electrode comprises a second body electrode part, and a second-first branch electrode part, a second-second branch electrode part extending from the second body electrode part in a direction of a first assembly electrode part and spaced apart from each other, and wherein the first assembly electrode is disposed between the second-first branch electrode part and the second-second branch electrode part spaced apart.

8. The display device having the semiconductor light emitting device according to claim 7, wherein the first assembly electrode comprises a first body electrode part and a first extended electrode part extending from the first body electrode part in a direction of a second assembly electrode part, and wherein the first extended electrode part comprises a first expanded electrode part having a shape corresponding to a horizontal cross-section of the semiconductor light emitting device.

9. The display device having the semiconductor light emitting device according to claim 8, wherein the second-first branch electrode part or the second-second branch electrode part comprises a curved recess inside thereof, and the first expanded electrode part comprises a shape corresponding to the curved recess.

10. A display device having a semiconductor light emitting device, the display device comprising:

a substrate;

a first assembly electrode disposed on the substrate;

a second assembly electrode disposed on the first assembly electrode;

an insulating layer disposed between the first assembly electrode and the second assembly electrode;

a second insulating layer disposed on the second assembly electrode and the insulating layer;

an assembly barrier wall including an assembly hole and disposed on the second assembly electrode; and the semiconductor light emitting device disposed in the assembly hole, wherein the second assembly electrode comprises a second body electrode part, and a second-first branch electrode part, a second-second branch electrode part extending from the second body electrode part in a direction of a first assembly electrode part and spaced apart from each other, and wherein the first assembly electrode is disposed between the second-first branch electrode part and the second-second branch electrode part spaced apart.

\* \* \* \* \*